(12) United States Patent
Kellerman et al.

(10) Patent No.: US 6,905,984 B2
(45) Date of Patent: Jun. 14, 2005

(54) MEMS BASED CONTACT CONDUCTIVITY ELECTROSTATIC CHUCK

(75) Inventors: Peter L. Kellerman, Essex, MA (US); Shu Qin, Malden, MA (US); Ernie Allen, Rockport, MA (US); Douglas A. Brown, S. Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/683,679

(22) Filed: Oct. 10, 2003

(65) Prior Publication Data

US 2005/0079737 A1 Apr. 14, 2005

(51) Int. Cl.[7] .............................................. H01L 21/00
(52) U.S. Cl. ...................................... 438/964; 438/597
(58) Field of Search .................................. 438/964, 174, 438/194, 217, 288, 379, 539, 540, 598, 599, 597

(56) References Cited

U.S. PATENT DOCUMENTS

| | | | |
|---|---|---|---|
| 5,583,736 A | | 12/1996 | Anderson et al. |
| 5,810,933 A | * | 9/1998 | Mountsier et al. ........... 118/724 |
| 5,838,529 A | * | 11/1998 | Shufflebotham et al. ..... 361/234 |
| 6,033,544 A | * | 3/2000 | Demers et al. .............. 204/450 |
| 6,378,600 B1 | | 4/2002 | Moslehi |

* cited by examiner

*Primary Examiner*—David Nhu
(74) *Attorney, Agent, or Firm*—Eschweiler & Associates LLC

(57) ABSTRACT

The present invention is directed to a method for clamping and processing a semiconductor substrate using a semiconductor processing apparatus. According to one aspect of the present invention, a multi-polar electrostatic chuck and associated method is disclosed which provides heating or cooling of a substrate by thermal contact conduction between the electrostatic chuck and the substrate. The multi-polar electrostatic chuck includes a semiconductor platform having a plurality of protrusions that define gaps therebetween, wherein a surface roughness of the plurality of protrusions is less than 100 Angstroms. The electrostatic chuck further includes a voltage control system operable to control a voltage applied to the electrostatic chuck to thus control a contact heat transfer coefficient of the electrostatic chuck, wherein the heat transfer coefficient of the electrostatic chuck is primarily a function of a contact pressure between the substrate and the plurality of protrusions.

26 Claims, 17 Drawing Sheets

MEMS BASED CONTACT CONDUCTIVITY ELECTROSTATIC CHUCK

RELATED APPLICATIONS

This application is related to, U.S. application Ser. No. 10/642,939, filed on Aug. 18, 2003, entitled, "MEMS Based Multi-polar Electrostatic Chuck", and U.S. application Ser. No. 10/657,449, filed on Sep. 8, 2003, entitled, "Clamping and De-clamping Semiconductor Wafers on an Electrostatic Chuck Using Wafer Inertial Confinement by Applying a Single-Phase Square wave AC Clamping Voltage", which are incorporated herein in their entirety, and U.S. Application Ser. No. 10/695,153, filed on Oct. 28, 2003, entitled, "Method of Making a MEMS Electrostatic Chuck",

FIELD OF THE INVENTION

The present invention relates generally to semiconductor processing systems, and more specifically to an apparatus and method for clamping a substrate and transferring thermal energy associated therewith.

BACKGROUND OF THE INVENTION

Processing of silicon wafers is commonplace in the manufacture of modern microelectronics devices. Such processing, including plasma processing and ion implantation may be performed at low pressures, wherein RF or microwave plasmas are delivered to the wafer, therein producing high temperatures at the wafer during processing. Such high temperatures (e.g., temperatures exceeding 400C), however, can have deleterious effects on the wafer.

For many processes, precise temperature control is not required, as long as the wafer temperature remains at less than a predetermined limit, such as 400C or below. Current trends in ion implantation, however, are tending toward high power serial implanters which generally require cooling with heat transfer coefficients HTC>200 mW/cm$^2$C. In these and several other implant operations, a precise temperature control is typically required, wherein HTC uniformity across a 300 mm wafer, for example, needs to be maintained within 1%. Such processes can have an HTC value, for example, as high as 500 mW/cm$^2$C. It is in meeting these high performance requirements that the current invention is directed.

Wafer temperature control in semiconductor processing has utilized electrostatic chucks (ESCs) for some time. A typical single-polar ESC is illustrated in FIG. 1, wherein the ESC 10 holds the wafer 20 in place by electrostatic force. The wafer 20 is separated from an electrode 30 by an insulating layer 40. A voltage (e.g., illustrated as a +) is applied to the electrode 30 by a voltage source 50. The voltage applied to the electrode produces an electrostatic field (e.g., illustrated as a "−") at the wafer 20 which induces an equal and opposite charge (e.g., illustrated as a +) on the wafer 20. The electrostatic field on the wafer 20 produces an electrostatic force between the wafer and the ESC 10. Consequently, the electrostatic force holds the wafer 20 against the insulating layer 40.

Cooling of the wafer 20 when utilizing ESCs can be provided by contact conductivity between the wafer and the contact surface 60 of the insulating layer 40, wherein the insulating layer may be cooled by cooling water. Conventionally, the cooling of the wafer 20 generally increases with the voltage applied to the ESC. Significantly high voltages, however, can have deleterious effects on the wafer (e.g., a cause of particle generation), and may further have costly power supply and consumption considerations, along with increased failure rates.

Other conventional ESCs utilize a cooling gas between the wafer 20 and the insulating layer 40, wherein a contact surface 60 of the insulating layer 40 comprises a plurality of protuberances (not shown), therein providing a region for the cooling gas to reside. Typically, a ceramic layer is conventionally machined to form protuberances therein, wherein the protuberances are formed by bead blasting. However, conventionally machining an insulating layer 40 comprised of a ceramic typically has several drawbacks, both in terms of precision, as well as potential particulate concerns caused by the ceramic layer during wafer processing.

Furthermore, it is typically very difficult to obtain a chuck surface flatness (i.e., control a waviness of the surface) of less than 5 microns across a 300 mm workpiece using conventional mechanical machining methods. For example, when the wafer contacts the conventional chuck surface, a gap width between chuck and wafer surfaces is typically within the 5 micron range due to the waviness of the chuck surface. This gap, however, is not uniform across wafer, and further varies depending on clamping conditions. Models and measurements indicate that, conventionally, an average gap width typically varies between 2.2 microns and 5 microns, depending on the surface and clamping conditions. This relatively large and uncontrollable gap width across the wafer typically results in a lower cooling capability and a non-uniform temperature across the wafer.

Still further, electrical connections to electrodes of the ESCs of the prior art have typically proven to be difficult to form. Conventionally, a wire is soldered beneath the electrodes in a center portion of the electrodes. Such soldering can disadvantageously perturb the heat conduction uniformity across the wafer.

Thus, there is a need in the art for an improved electrostatic chuck that provides a uniform HTC which is readily adjustable during processing, as well as a chuck which provides a higher thermal transfer ability in both cooling and heating of the wafer. Furthermore, a need exists for an electrostatic chuck that provides a clamping surface which is operable to significantly limit particulate contamination during wafer processing.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a multi-polar electrostatic chuck and method for cooling or heating a semiconductor substrate. The multi-polar electrostatic chuck, for example, comprises a clamping plate that is operable to efficiently clamp the substrate thereto, and to cool or heat the substrate in a generally uniform manner thereacross, thereby improving process control. According to one example, the clamping plate comprises a semiconductor platform, wherein a first electrically conductive layer is formed over a top surface thereof. The first electrically conductive layer further comprises a plurality of portions that are electrically isolated from one another, therein defining a plurality of poles or electrodes of the electrostatic chuck.

The clamping plate, for example, further comprises a plurality of electrically insulative protrusions operable to contact the substrate, wherein the plurality of protrusions provide a highly uniform contact surface. For example, the plurality of protrusions comprise a plurality of micro-electromechanical system (MEMS) structures which are sized such that a contact area ratio between the plurality of protrusions and a surface of the substrate is made substantially small (e.g., an area ratio of approximately 10%). A plurality of valleys defined by the plurality of protrusions, for example, further provide an area for contaminants, such as particulates, to reside without affecting the uniformity of a contact surface.

According to one exemplary aspect of the present invention, the electrostatic chuck is operable to exhibit a high degree of heating or cooling of the substrate by thermal contact conductivity between the substrate and the chuck, wherein the thermal conductivity is generally dependent on a contact pressure between the substrate and the plurality of protrusions. The plurality of protrusions, for example, are operable to generally transfer heat between the substrate and the clamping plate, wherein the uniformity of the plurality of protrusions is operable to provide a significantly higher degree of HTC uniformity across the wafer, as opposed to conventional ESCs. Furthermore, a voltage required to successfully operate the electrostatic chuck can be maintained at less than approximately 150V.

According to another exemplary aspect of the present invention, a method for heating or cooling a substrate in a semiconductor processing system is disclosed, wherein the semiconductor processing system comprises a multi-polar electrostatic chuck comprising a semiconductor platform having a plurality of MEMS protrusions. The method comprises placing the substrate on the plurality of protrusions and applying a voltage across two or more electrodes associated with the electrostatic chuck, wherein the substrate is substantially electrostatically clamped to the clamping plate. The voltage is controlled, therein controlling a contact pressure between the plurality of protrusions and the substrate, wherein the contact pressure is associated with a contact heat transfer coefficient between the substrate and the electrostatic chuck. A generally uniform contact pressure is maintained across the surface of the substrate, wherein the substrate is heated or cooled by thermal contact conduction between the substrate and the clamping plate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
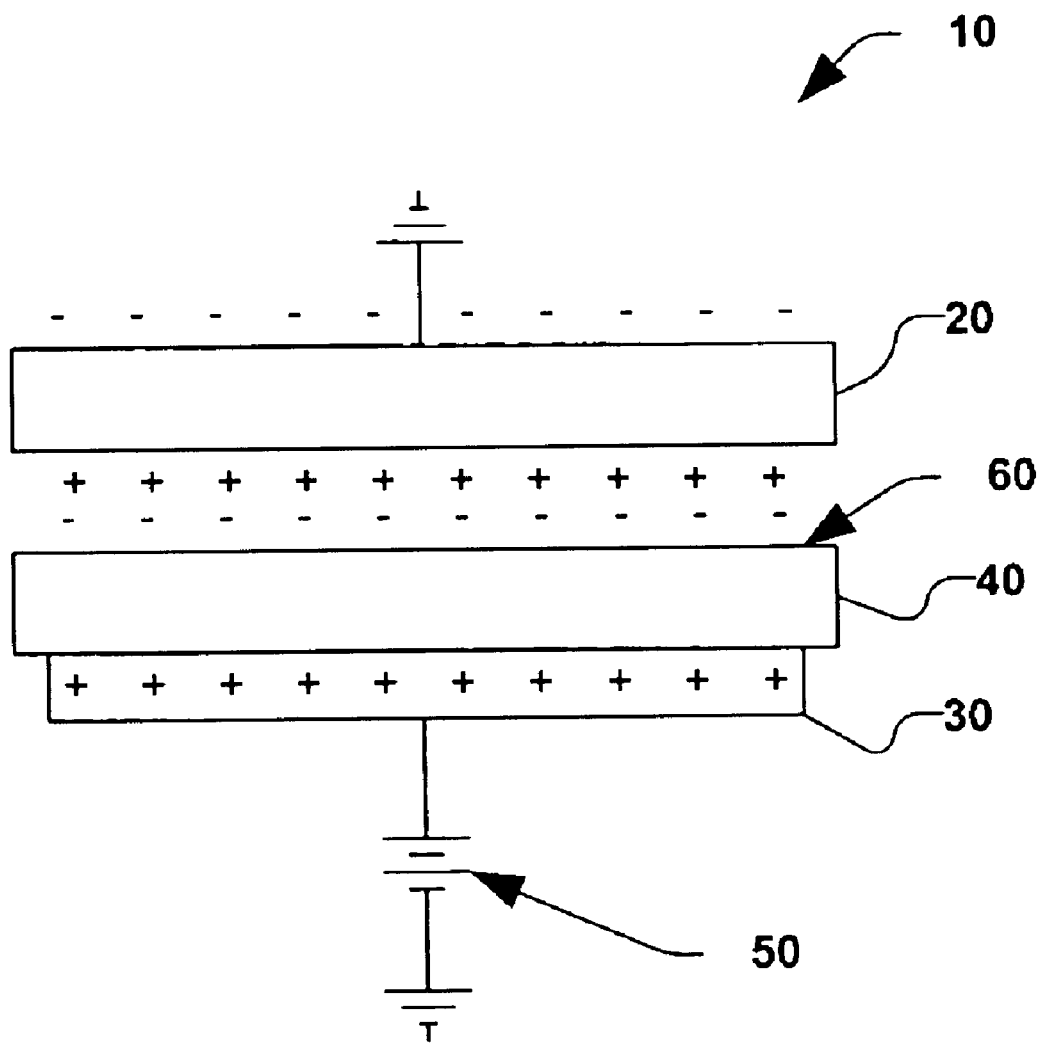
FIG. 1 is a partial cross-sectional view of an exemplary prior art electrostatic chuck.

The present invention is directed towards a multi-polar electrostatic chuck (ESC) and an associated system and method that incorporate several inventive features thereof. In particular, the electrostatic chuck of the present invention increases an ability to uniformly heat or cool a wafer substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art via a multi-polar electrostatic chuck (ESC) that exhibits a significantly spatially uniform heat transfer coefficient (HTC) between a substrate (e.g., a silicon wafer) and a semiconductor clamping plate associated with the ESC. One approach to controlling an HTC between the wafer and the ESC is to utilize thermal contact conductivity between the substrate and the clamping plate, wherein a voltage applied to the clamping plate generally determines an amount of contact force, and thus, contact thermal conductivity, between the substrate and the clamping plate. HTC uniformity, however, is typically dependent on contact pressure uniformity. One way of maintaining a uniform HTC is to provide a uniform clamping surface. Clamping surfaces having a large contact area with the substrate, however, generally require a large contact pressure across the substrate, and thus, generally require a large differential voltage to be applied across electrode pairs of the ESC in order to attain a significantly high HTC. Removing a portion of the clamping surface in accordance with the present invention allows for a reduction in applied voltage, while increasing the contact pressure per unit area.

For example, an area of the clamping plate surface is removed, wherein the remaining portions generally define a plurality of protrusions whereon the substrate resides. In accordance with one aspect of the present invention, an area ratio between a contact surface area of the clamping plate and a surface area of the substrate is optimized, wherein a maximum heat transfer can take place through the plurality of protrusions, while minimizing stress to the substrate. Furthermore, the plurality of protrusions generally provide for low voltages (e.g., less than approximately 500 volts) to be utilized in clamping the substrate, as will be discussed infra, wherein stress to the substrate and particulate generation are limited.

A gap is further defined between each of the plurality of protrusions, wherein, in one example, a practical limit to the dimensions of the plurality of protrusions and the gap is contemplated based on backside particles. For example, particles larger than a depth of the gap may cause a failure of the substrate to contact the plurality of protrusions, thereby degrading reliability. Since most particles seen in a typical ESC are less than 1 micron, a lower limit to the depth of the gap, in one example, is approximately 1 micron. Furthermore, in order to minimize stresses in the substrate, a width of the gap (e.g., a distance between protrusions) is approximately equal to a thickness of the substrate.

Another challenge overcome by the present invention is achieving a control of the surface while further allowing the ESC to be multi-polar. Uni-polar clamps (e.g., wherein the entire ESC is one electrode) can be used in applications in which the wafer is exposed to a plasma, wherein a conductive path is created between the wafer and electrical ground. However, in applications wherein the wafer is not in constant contact with a plasma, a minimum of two (2) electrodes is typically necessary, wherein each electrode has an opposite polarity, thereby allowing the wafer to remain at virtual ground without an electrical connection through the wafer. Thus, a multi-polar electrostatic chuck is introduced by the present invention which comprises precise surface control while allowing multiple electrodes to be incorporated and electrically connected to a power supply.

Figure 2:
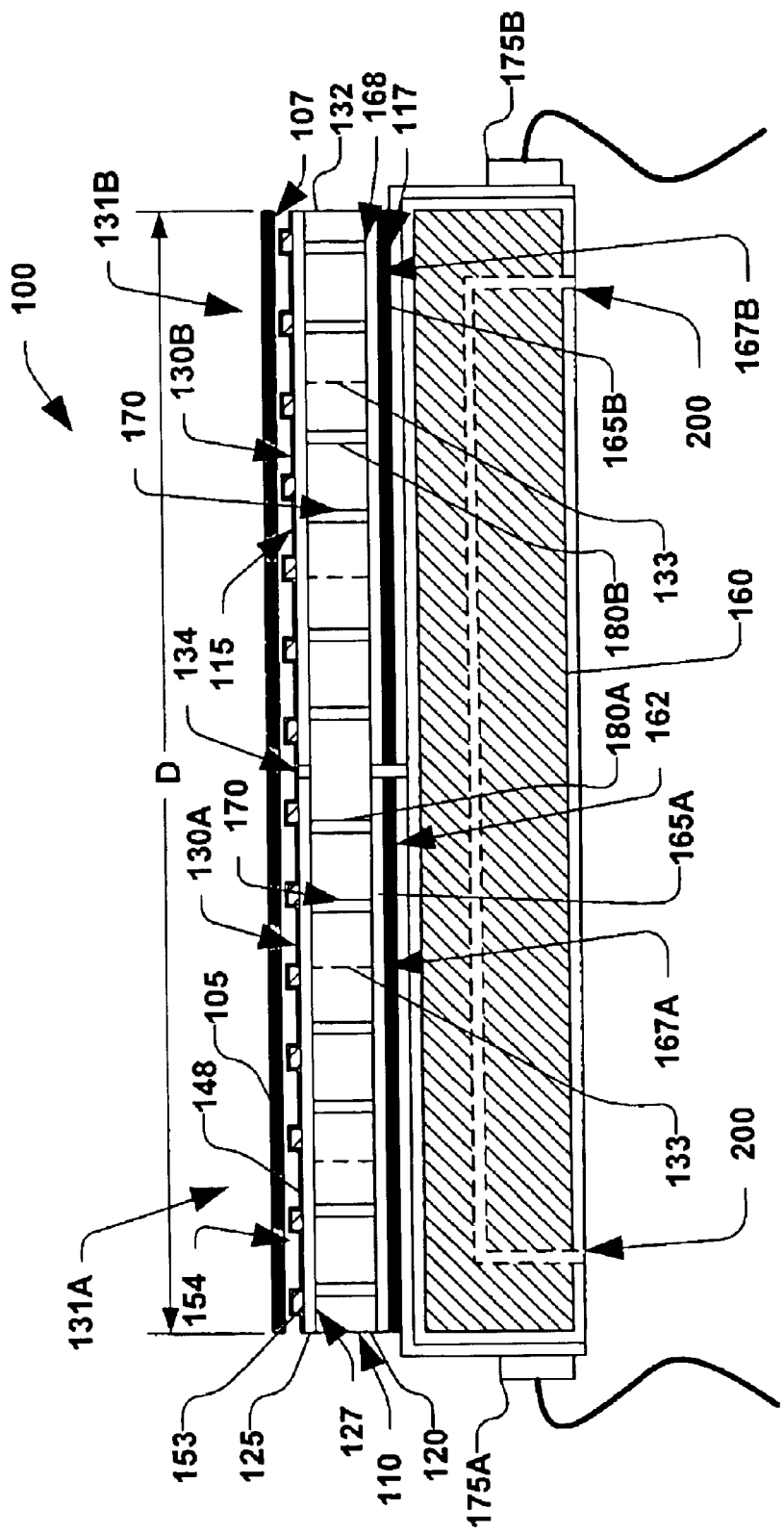
FIG. 2 is a partial cross-sectional view of an electrostatic chuck according to one exemplary aspect of the present invention.

Referring now to the figures, FIG. 2 of the present invention illustrates a cross-sectional view of an exemplary multi-polar ESC 100 according to one aspect of the invention, wherein the ESC is operable to support and transfer thermal energy associated with a substrate 105 residing thereon (e.g., heat or cool the substrate). The substrate 105, for example, is generally characterized by a diameter D and a bottom surface 107, wherein the bottom surface has a first surface area (not shown) associated therewith. It should be noted that the electrostatic chuck 100 of FIG. 1 is illustrated macroscopically for simplicity, however, subsequent Figures (e.g., FIGS. 3, 4 and others) are provided which illustrate exemplary alternative views of the electrostatic chuck 100 in further detail.

The electrostatic chuck 100 of FIG. 2 of the present invention comprises a generally planar clamping plate 110 having a top surface 115 associated with the bottom surface 107 of the substrate 105 and an oppositely disposed bottom surface 117. The clamping plate 110, for example, comprises a semiconductor platform 120, wherein a first electrically conductive layer 125 is formed over a top surface 127 of the semiconductor platform. The first electrically conductive layer 125 is comprised of a plurality of portions 130, wherein the plurality of portions are generally electrically isolated from one another, therein defining a plurality of poles 131 of the multi-polar ESC 100, as will be discussed hereafter. The semiconductor platform 120, for example, comprises a semiconductor substrate 132, such as a silicon wafer, wherein the plurality of portions 130 of the first conductive layer 125 formed thereover are generally defined by an isolator region 134 between the plurality of portions 130. The isolator region 134 generally electrically isolates the plurality of portions 130 of the first electrically conductive layer 125 from one another, wherein a voltage applied to the plurality of portions 130 is operable to generate an electrostatic force between the clamping plate 110 and the substrate 105.

According to one exemplary aspect of the present invention, the clamping plate 110 is formed using semiconductor lithographic techniques, as will be described infra, wherein the isolator region 134, for example, is generally masked during the formation of the first electrically conductive layer 125. The semiconductor platform 120, for example, may be comprised of a single semiconductor substrate 132, or, alternatively, the semiconductor platform may comprise a mosaic of separate semiconductor substrates 132 (e.g., indicated as dashed lines 133), wherein the first electrically conductive layer 125 is further formed over the mosaic of semiconductor substrates. The mosaic of separate semiconductor substrates 132, for example, forms the semiconductor platform 120 by a piecing together of the separate semiconductor substrates to form a generally contiguous semiconductor platform. Such a mosaic, for example, is advantageous for electrostatic chucks requiring a diameter larger than a standard silicon wafer, wherein several semiconductor substrates can be pieced together to form the a larger semiconductor platform 120.

Figure 9:
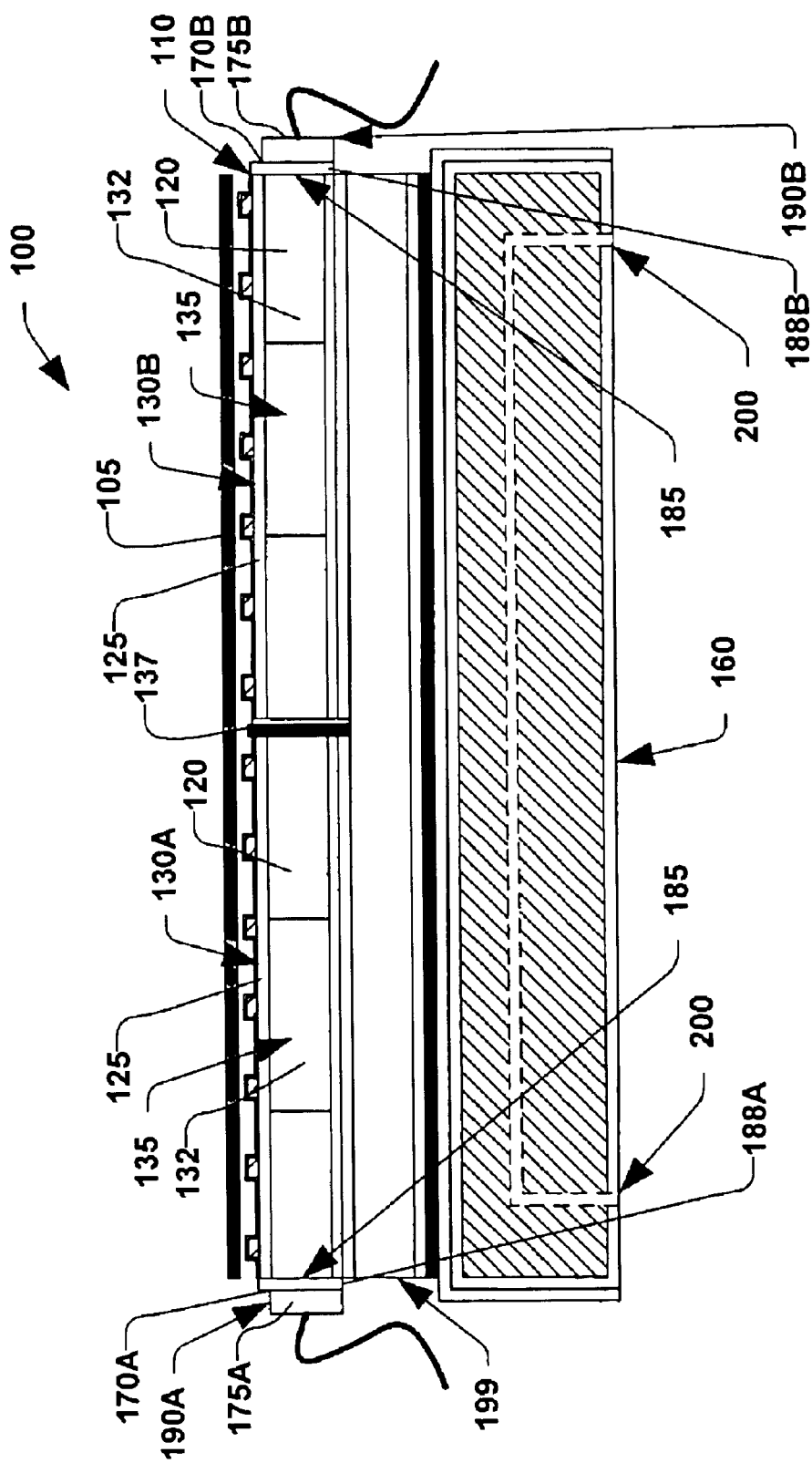
FIG. 9 is a partial cross-sectional view of an electrostatic chuck according to another exemplary aspect of the present invention.

In another alternative aspect of the present invention, as illustrated in FIG. 9, the semiconductor platform 120 may be comprised of a plurality of distinct segments 135 formed from separate semiconductor substrates 132, wherein the plurality of portions 130 of the first electrically conductive layer 125 are individually formed over each segment 135. The plurality of segments 135, for example, are separated from one another by an insulative material, such as a ceramic spacer 137, wherein the plurality of portions 130 of the first electrically conductive layer 125 are electrically isolated from one another.

Figure 3:
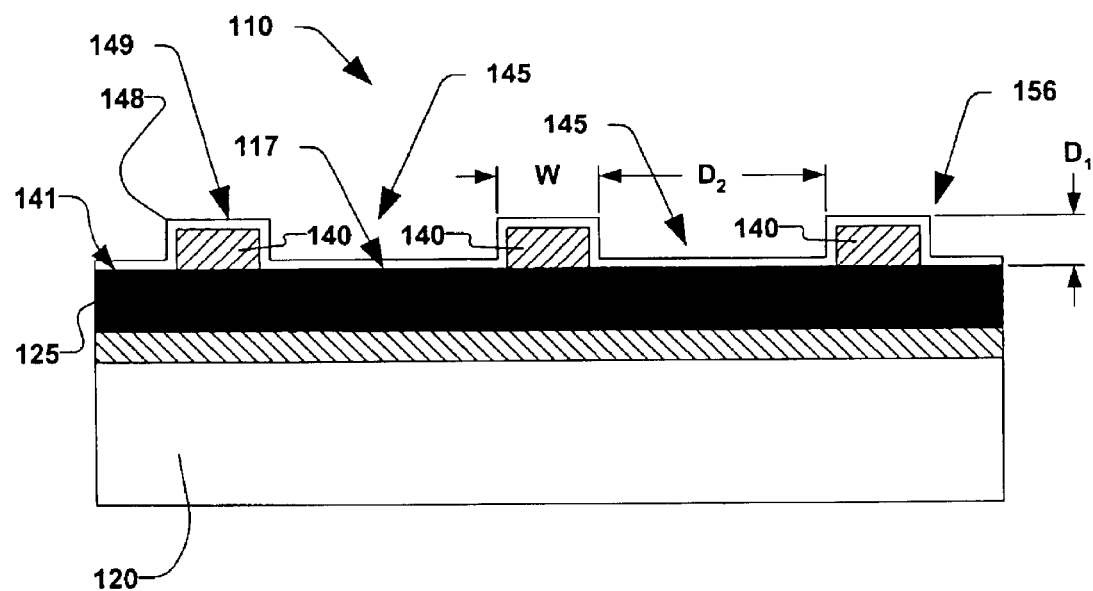
FIG. 3 is a partial cross-sectional view of an exemplary clamping plate having a plurality of protrusions according to an aspect of the present invention.

FIG. 3 illustrates a partial cross sectional view of a portion of the clamping plate 110 of FIG. 2, wherein several exemplary aspects of present invention are illustrated in greater detail. According to one exemplary aspect of the present invention, the clamping plate 110 further comprises a plurality of electrically insulative protrusions 140 generally extending outwardly from a top surface 141 of the first electrically conductive layer 125 of FIG. 2 (and hence, generally extending outwardly from the top surface 117 of the clamping plate 110). Referring again to FIG. 3, the plurality of protrusions 140 are generally formed over the first electrically conductive layer 125 and extend generally a first distance $D_1$ from the top surface 117 of the clamping plate 110. Accordingly, the plurality of protrusions 140 generally define a plurality of gaps 145 therebetween, wherein the plurality of protrusions, for example, are spaced from one another by a second distance $D_2$, thereby defining a width of the plurality of gaps. The second distance $D_2$ is generally less than a thickness of the substrate (not shown) to be clamped, whereby mechanical deflection of the substrate during clamping is significantly reduced, as will be discussed in greater detail hereafter. For example, the second distance $D_2$, is less than approximately 100 microns.

Figure 4:
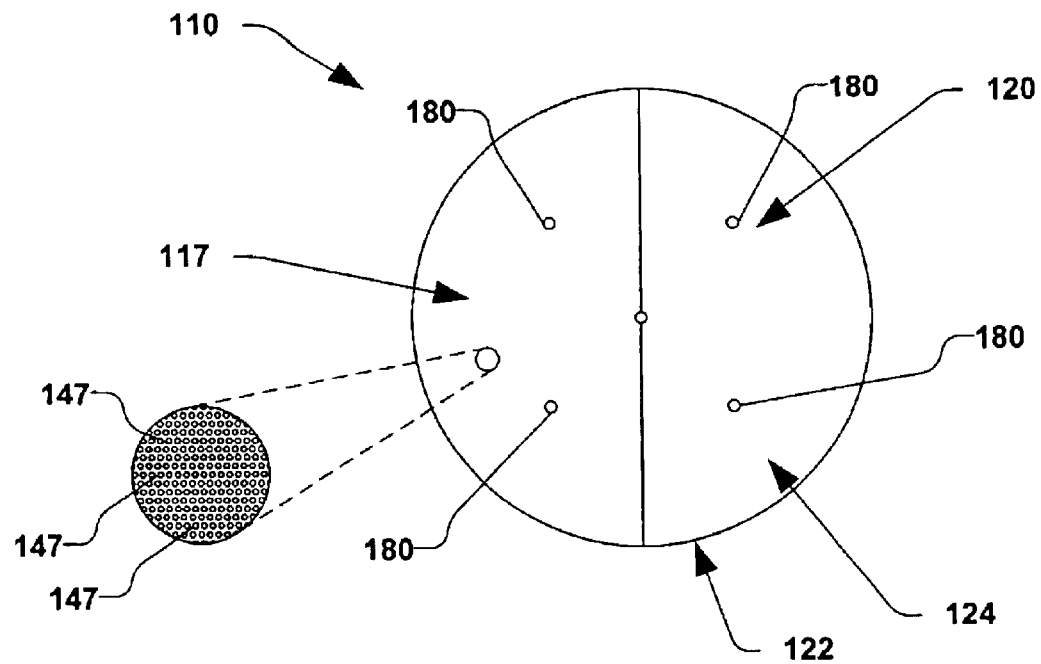
FIG. 4 is a plan view of an exemplary clamping plate comprising a plurality of protrusions according to an aspect of the present invention.

According to yet another exemplary aspect of the present invention, the plurality of protrusions 140 are comprised of microelectromechanical structures (MEMS). For example, the semiconductor platform 120 is comprised of a material which is typically utilized in forming MEMS microstructures, such as silicon, wherein the plurality of protrusions 140, for example, are comprised of silicon dioxide ($SiO_2$) formed thereover. MEMS microstructures generally provide a tightly-controlled and consistent dimensional integrity across the top surface 117 of the clamping plate 110, wherein the plurality of protrusions 140 extend a generally consistent first distance $D_1$ from the top surface across the clamping plate. For example, FIG. 4 illustrates the plurality of protrusions 140 comprising a plurality of substantially cylindrical or rectangular islands 147 which have been formed over the top surface 117 of the clamping plate 110. The plurality of protrusions 140 are operable to generally contact the bottom surface 107 of the substrate 105 illustrated in FIG. 2, thereby defining a protrusion contact area. Preferably, the protrusion contact area ratio (AR) is around 10% of the total of the bottom surface area of the substrate 105. For example, the plurality of islands 147 of FIG. 3 have a diameter of about 10 microns or less, and are spaced from one another by approximately 25 microns.

Although the plurality of protrusions 140 extending from the top surface 117 of the clamping plate 110 are illustrated as being of uniform shape and arranged in an ordered manner, other arrangements of the plurality of protrusions are also contemplated, and any shape or order of protrusions or other such alternatives are contemplated as falling within the scope of the present invention. Referring again to FIG. 2, the top surface 127 of the semiconductor platform 120 and the plurality of protrusions 140 may furthermore comprise, for example, a protective coating 148, such as a silicon nitride ($Si_3N_4$) layer, formed thereover. The protective coating 148, as illustrated in FIG. 3, for example, can have a low emissivity, wherein heat emitted from the substrate (not shown) toward the clamping plate 115 is reflected from the protective coating during a heating of the substrate. According to another example, the protective coating 148 provides a substantially hard and inert interface 149 between the clamping plate 110 and the substrate (not shown), wherein the protective coating generally decreases the possibility of contamination from a degradation of the clamping plate. According to yet another example, the protective coating 148 is operable to generally permit the substrate (not shown) to slide laterally over the interface 149 between the clamping plate 110 and the substrate.

Figure 5:
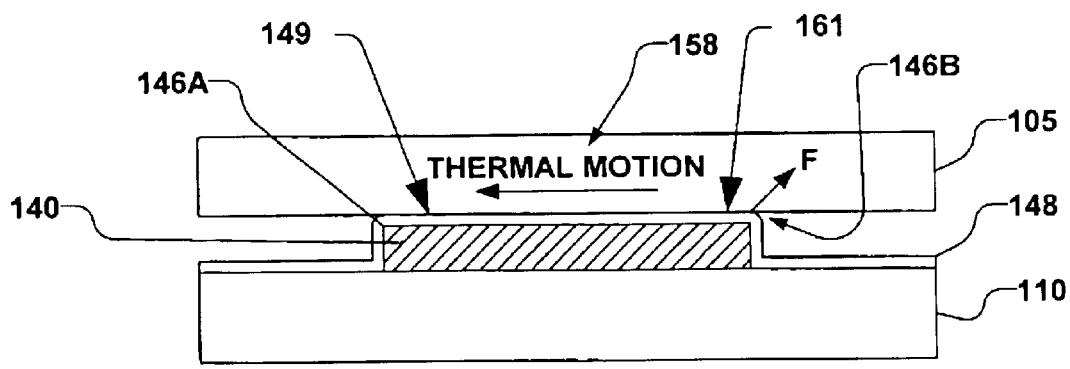
FIG. 5 is a partial cross-sectional view of an exemplary protrusion according to an aspect of the present invention.

FIG. 5 illustrates an exemplary protrusion 140, wherein the protective coating 148 generally conforms to the plurality of the protrusions 140 and has generally rounded the one or more sharp edges 146A, thereby defining one or more rounded edges 146B of the protrusion. The one or more rounded edges 146B, for example, provide advantageous sliding characteristics during a thermal motion (e.g., a thermal expansion or contraction) of the substrate 105 with respect to the clamping plate 110. For example, the thermal motion 158 of the substrate 105 relative to the protrusion 140 can create a force F on the substrate 105 by the protrusion 140. The force F varies depending on, at least in part, the geometry of the protrusion 140. For example, sharp edges 156, as illustrated in FIG. 3, are more likely to create a large force F, wherein the substrate 105 is likely to laterally bind at the sharp edge of the protrusion 140. Stress fractures may appear in the substrate 105, for example, if the force F exceeds the yield strength of the substrate, thereby causing potential contamination and/or damage to the substrate. The rounded edges 146B of FIG. 5 on the other hand, generally limit the force F on the substrate 105 by spreading the force over the rounded edges. Limiting the force F on the substrate 105 generally permits the substrate to more freely expand or contract with respect to the clamping plate 110, thereby generally limiting lateral binding at the protrusion 140.

Figure 6:
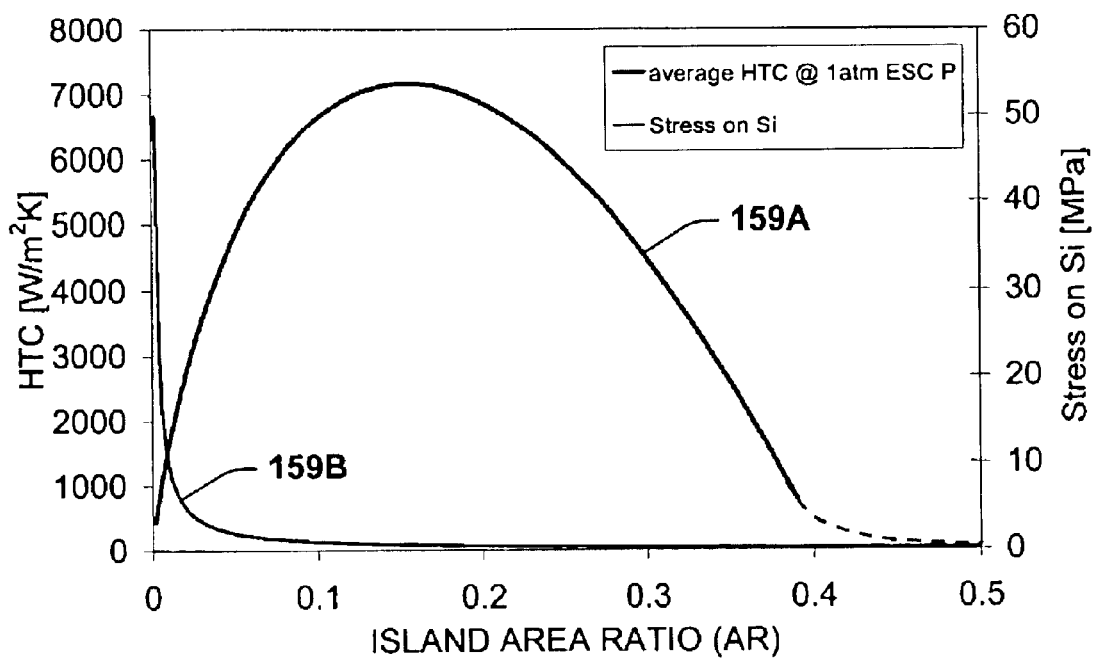
FIG. 6 is a graph illustrating contact heat transfer coefficient and stress on an exemplary clamping plate relative to area ratio according to an aspect of the present invention.

The contact conductivity discussed above may be more fully appreciated in conjunction with FIG. 6, which illustrates a graph of the contact HTC and wafer stress for various contact area ratios. For example, at low contact area ratios (e.g., an AR of about 0.05 or less) the contact HTC (graph 159A) is small due to the small contact area between the protrusions and the wafer. Such small area ratios typically cause the stress (graph 159B of FIG. 6) on the substrate to be undesirably high, especially at high electrostatic chuck pressures. According to one exemplary aspect of the invention, mechanical pressure from the ESC between the substrate 105 of FIG. 2 and the plurality of protrusions 140 determines, at least in part, the thermal contact HTC between the substrate and the clamping plate 110, wherein the thermal contact HTC generally decreases at low mechanical pressures.

Referring again to FIG. 6, as the contact AR increases (e.g., protrusion contact area of all the protrusions being a larger proportion of the entire wafer area), the contact HTC begins to increase, reach a maximum and decrease again, which reflects the trade-offs that occur due to increased area and reduced contact pressure per unit area on the protrusions. In this range (e.g., between an AR of about 0.05 to about 0.3) the contact HTC is relatively high, thereby making switching of a cooling of the ESC via a control of voltage to the ESC highly efficient. At higher contact area ratios, for example, ARs of about 0.4 or more, the stress on the substrate is negligible, however, the contact HTC is lower for the same power input to the ESC to maintain the same contact pressure.

Referring again to FIG. 3, according to another exemplary aspect of the present invention, the plurality of protrusions 140 are operable to generally maintain the first distance $D_1$ of FIG. 2 from the top surface 117 of the clamping plate to the bottom surface 107 of the substrate 105, wherein the contact conductivity through the plurality of protrusions is uniform across the clamping plate. This is accomplished by tightly controlling the surface roughness of the plurality of protrusions. For example, as illustrated again in FIG. 4, a surface roughness 161 (e.g., a surface finish) of less than 100 Angstroms is attainable for each of the plurality of protrusions 140 through MEMS-based semiconductor processing, wherein the contact conductivity through such a fine surface finish can be significantly enhanced, as compared to conventional mechanically machined surfaces of the prior art.

Figure 7:
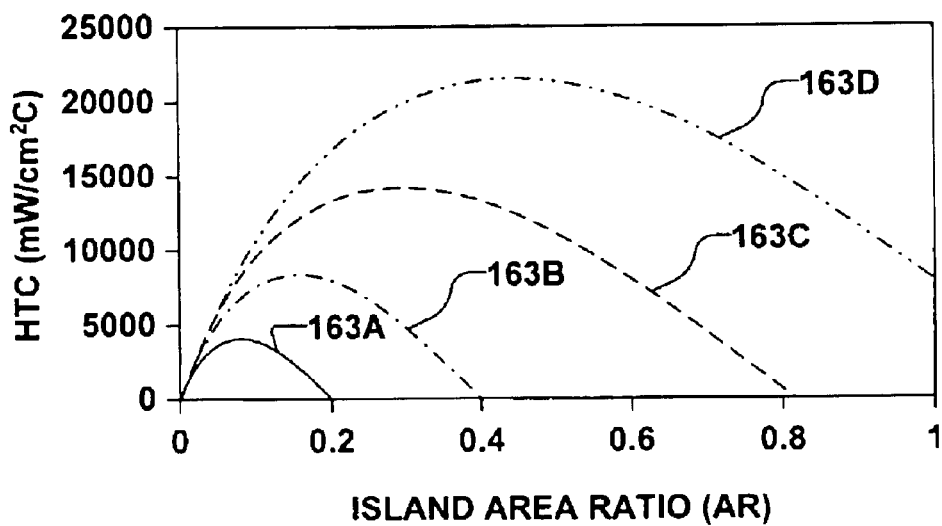
FIG. 7 is a graph illustrating a contact heat transfer coefficient relative to area ratio of an exemplary clamping plate according to an aspect of the present invention.

The graph of FIG. 7 illustrates contact heat transfer coefficients for an exemplary MEMS-based electrostatic chuck. Curves 163A–163D illustrate average HTCs at 0.5, 1, 2, and 5 atmospheres of contact pressure, respectively, between the substrate 105 and the plurality of MEMS-based protrusions 140 of FIG. 2. As can be seen, HTC increases rapidly at low ARs, reaches a maximum, and gradually decreases as the AR reaches 100%. Using the data from FIG. 7, the inventors of the present invention appreciated that an optimum AR can be determined for the MEMS-based protrusions 140. Preferably, the AR is less than approximately 0.5, and more preferably within a range of approximately 0.02 and 0.2. For example, an AR of approximately 0.1

(10%) is approximately optimum for contact pressures between 0.5 and 1.0 atmospheres. For present and currently anticipated semiconductor manufacturing processes, an HTC ranging up to approximately 3000 mW·cm$^{-2}$·C$^{-1}$ exceeds heat transfer requirements, while enabling low-voltage operation, therein defining an optimal AR to a range of less than about 0.2.

According to another exemplary aspect of the invention, the exemplary electrostatic chuck 100, as illustrated in FIG. 2, further comprises a base plate 160 operable to transfer thermal energy from the substrate 105 and the clamping plate 110. The base plate 160, for example, is generally characterized by a top surface 162 associated with the bottom surface 117 of the clamping plate 110. The top surface 162 of the base plate 160, for example, generally faces the bottom surface 117 of the clamping plate 110, wherein the base plate and the clamping plate are thermally coupled to one another. The base plate 160, for example, is comprised of a material that provides good thermal conductivity, such as a metal. Exemplary base plate 160 metals are aluminum, copper, or other metal alloys with good thermal conductivity. Alternatively, the base plate 160, for example, is comprised of a material having a thermal conductivity similar to a thermal conductivity of the clamping plate 110, such as amorphous silicon (a-Si) or silicon carbide (SiC).

According to another exemplary aspect of the present invention, the clamping plate 110 further comprises a second electrically conductive layer 165, wherein the second electrically conductive layer further comprises a plurality of portions 167 electrically isolated from one another. The plurality of portions 167 of the second electrically conductive layer 165 electrically connect to the respective plurality of portions 130 of the first electrically conductive layer 125. The plurality of portions 167 of the second electrically conductive layer 165, for example, generally reside between a bottom surface 168 of the semiconductor platform 120 and the top surface 162 of the base plate 160. According to one example, the plurality of portions 167 of the second electrically conductive layer 165 are formed over the bottom surface 168 of the semiconductor platform 120 during the formation of the first conductive layer 125 over the top surface 127 of semiconductor platform 120.

According to still another exemplary aspect of the present invention, the second electrically conductive layer 165 further comprises a plurality of electrically conductive vertical interconnects 170. The vertical interconnects 170, for example, electrically connect the first electrically conductive layer 125 and the second electrically conductive layer 165. A plurality of electrodes 175, for example, are further electrically connected to the second electrically conductive layer 165, therein electrically connecting the first electrically conductive layer 125 to the plurality of electrodes via the plurality of vertical interconnects 170. The plurality of vertical interconnects 170 may comprise, for example, a plurality of vias 180 associated with the semiconductor platform 120, wherein the plurality of vias generally extend from the top surface 127 to the bottom surface 168 of the semiconductor platform. The plurality of vias 180, therefore, electrically connect each portion 130 of the first electrically conductive layer 125 to the respective portion 167 of the second electrically conductive layer 165. Each portion 130 and 167 of the first electrically conductive layer 125 and second electrically conductive layer 165, respectively, may be electrically connected, for example, by one or more of the plurality of vias 180 (e.g., portion 130A is electrically connected to portion 167A through one or more vias 180A).

As illustrated in FIG. 4, for example, the plurality of vias 180 are generally oriented about the semiconductor platform 120 such that the clamping plate 110 is substantially thermally and electrically balanced.

According to another example, FIG. 9 illustrates another exemplary ESC 100, wherein the plurality of vertical interconnects 170 are associated with a sidewall 185 of the semiconductor platform 120, therein defining a plurality of sidewall interconnects 188. Each portion 130 of the first electrically conductive layer 125, for example, is electrically connected to a respective sidewall interconnect 188, wherein each sidewall interconnect may be electrically connected to the respective electrode 175. For example, each respective electrode 175 comprises a spring-forced sidewall contact electrode 190, wherein the spring-forced sidewall contact electrodes are mechanically compressed against the respective sidewall interconnects 188 by a spring force (not shown), wherein physical bonding (e.g., brazing or epoxy bonding) of the electrodes to the sidewall interconnects is not necessary.

Figure 10:
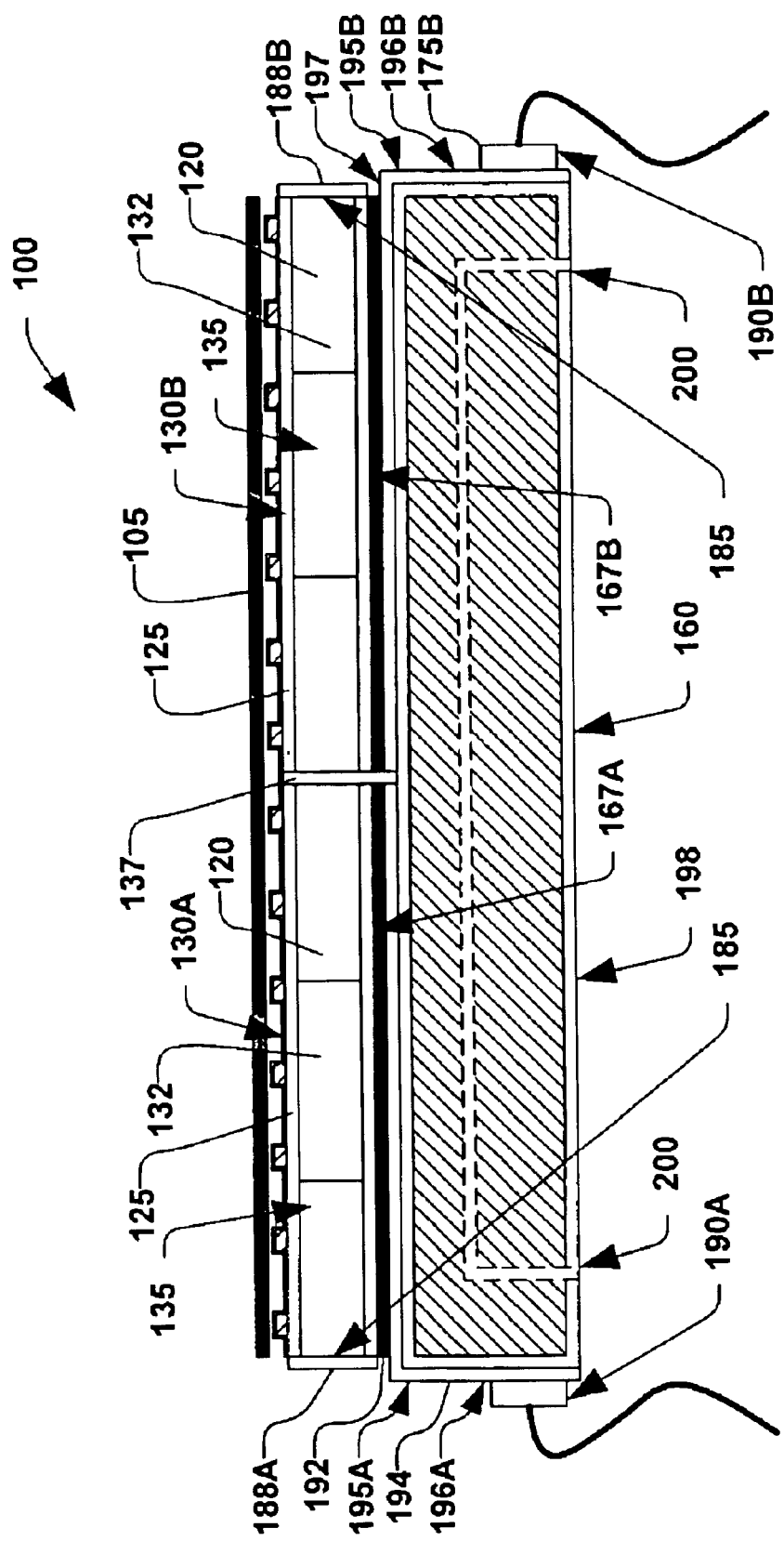
FIG. 10 is a partial cross-sectional view of an electrostatic chuck according to still another exemplary aspect of the present invention.

According to another exemplary aspect of the present invention, as illustrated in FIG. 10, the base plate 160 comprises a first electrically insulative layer 192 and a third electrically conductive layer 194 is formed thereover. The first electrically insulative layer 192 (e.g., an oxide) generally resides between the base plate 160 and the third electrically conductive layer 194. The third electrically conductive layer 194, for example, further comprises a plurality of portions 195 associated with the respective plurality of portions 130 and 167 of the first electrically conductive layer 125 and the second electrically conductive layer 165, respectively, wherein each portion 195 of the third electrically conductive layer 194 is electrically connected to the respective portion 167 of the second electrically conductive layer. The plurality of portions 195 of the third electrically conductive layer 194 are further electrically isolated from one another, therein keeping the poles of the ESC 100 electrically isolated. For example, the third electrically conductive layer 194 generally resides along a sidewall 196 and a top surface 197 of the base plate 160 (e.g., over the first insulative layer 192), wherein the plurality of electrodes 175 are electrically connected to the third electrically conductive layer at the sidewall of the base plate. Alternatively, the third electrically conductive layer 194 may further be formed over a bottom surface 198 of the base plate 160, wherein the plurality of electrodes 175 may be electrically connected to the third electrically conductive layer at the bottom surface of the base plate.

The third electrically conductive layer 194, for example, generally permits a bonding of the base plate 160 to the clamping plate 110, wherein the base plate can be thermally coupled to the clamping plate, and can be electrically connected to the second electrically conductive layer 165. One exemplary method of coupling the base plate 160 to the bottom surface 117 of the clamping plate 110 is accomplished by brazing, wherein the bottom surface 117 of the clamping plate is metallized (e.g., by the second electrically conductive layer 165) and then vacuum brazed to the top surface 162 of the base plate. For example, the third electrically conductive layer 194 is formed over the top surface 162 of the base plate 160, wherein the second and third electrically conductive layers 165 and 194 are vacuum brazed together. The second and third electrically conductive layers 165 and 194, for example, are comprised of one or more of tungsten silicide, tungsten, or titanium, however any electrically conductive material is contemplated as falling within the scope of the present invention.

According to another exemplary aspect of the invention, referring again to FIG. 9, an electrically insulative intermediate plate 199 resides between the base plate 160 and the clamping plate 110. The intermediate plate 199, for example, comprises an aluminum nitride insulator wafer, wherein the intermediate plate generally electrically insulates the clamping plate 110 from the base plate 160, and still provides adequate thermal conductance. Furthermore, the intermediate plate 199 may be vacuum-brazed to the base plate 160 and the clamping plate 110.

Figure 13A:
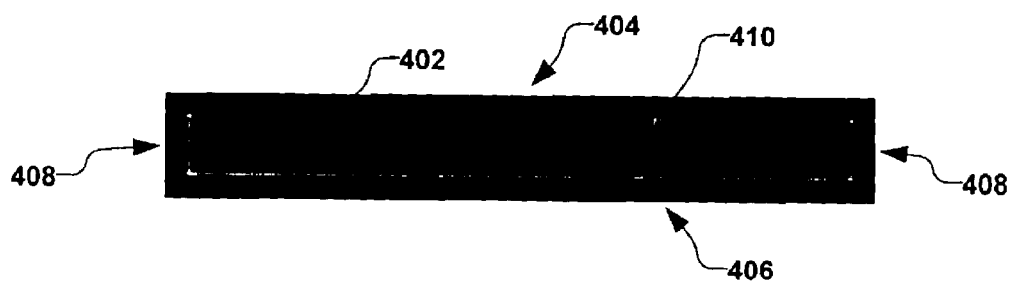
FIGS. 13A–13Q illustrate partial cross-sectional view of a simplified electrostatic chuck as formed by the method of FIG. 12 according to the present invention.
Figure 13B:
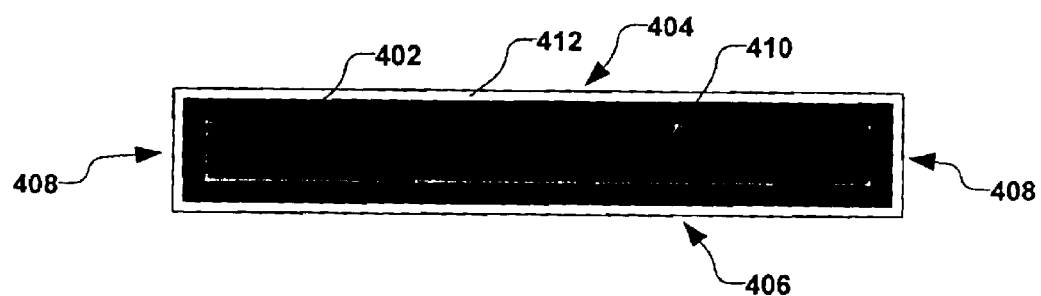
Figure 13C:
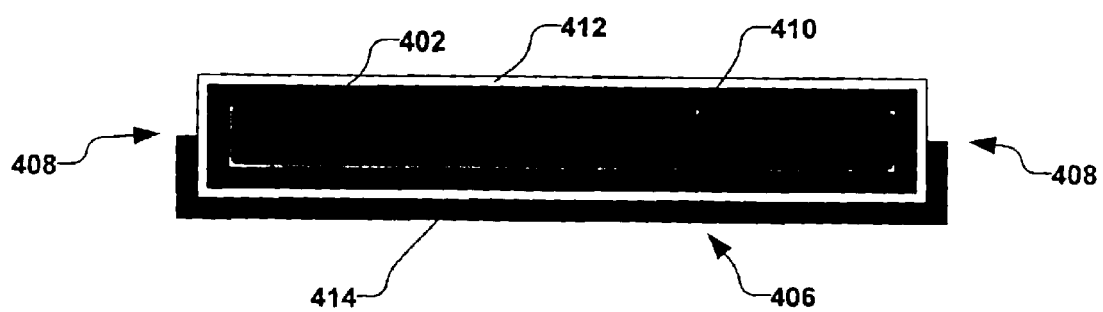
Figure 13D:
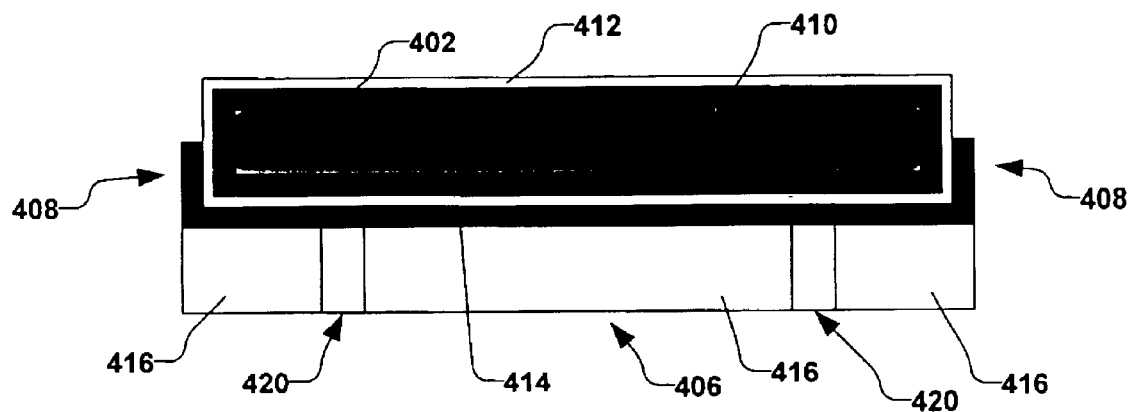
Figure 13E:
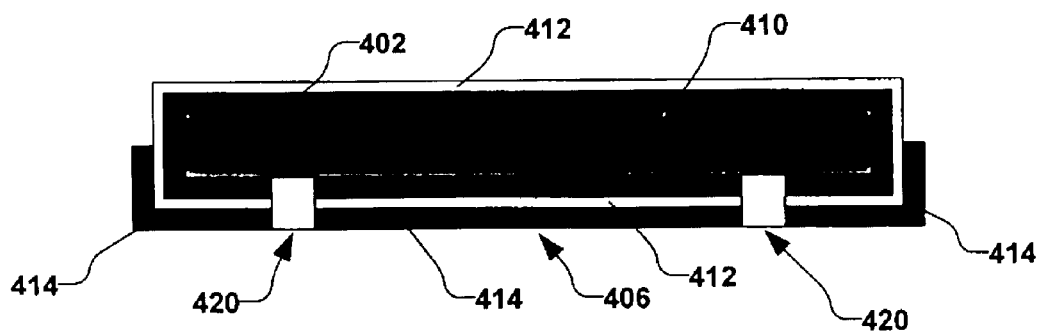
Figure 13F:
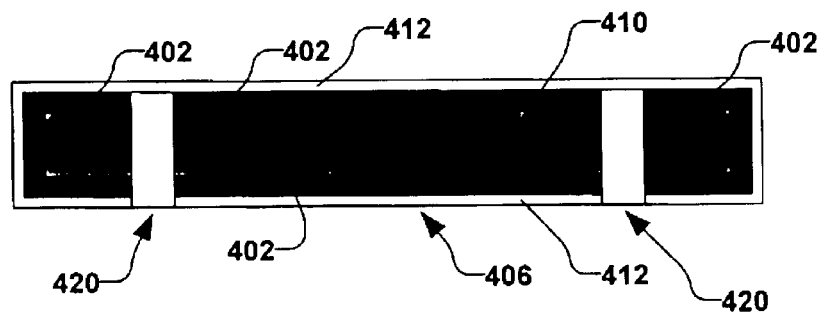
Figure 13G:
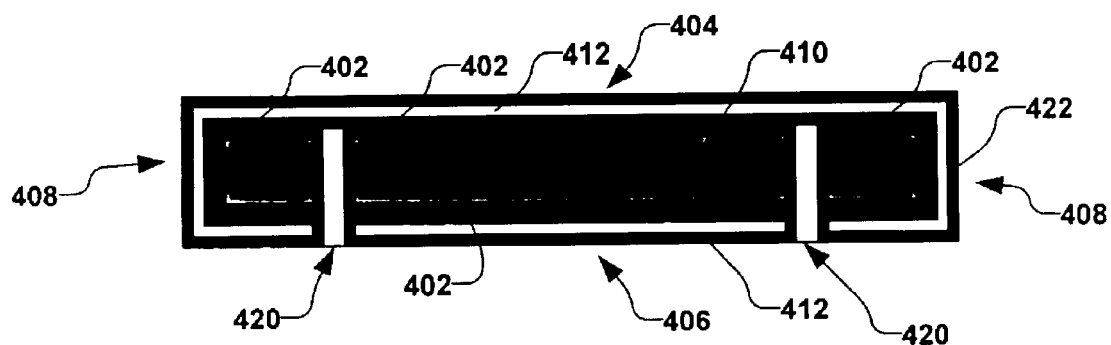
Figure 13H:
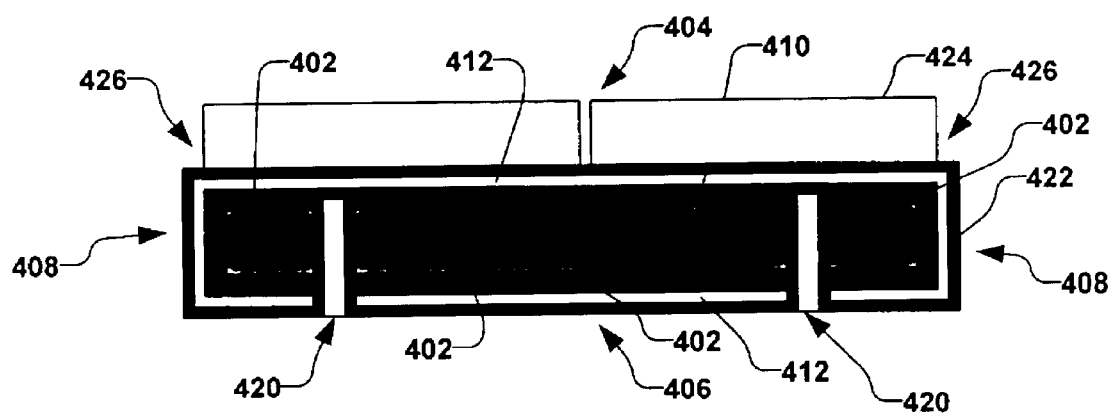
Figure 13I:
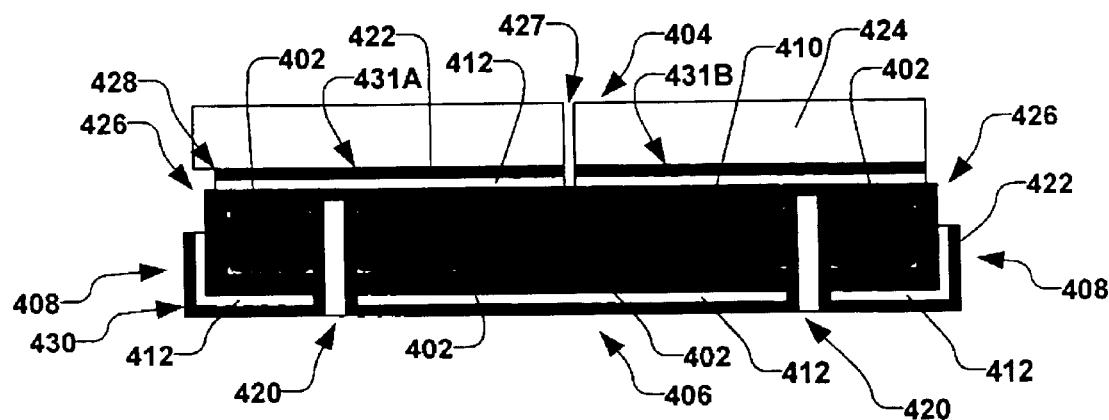
Figure 13J:
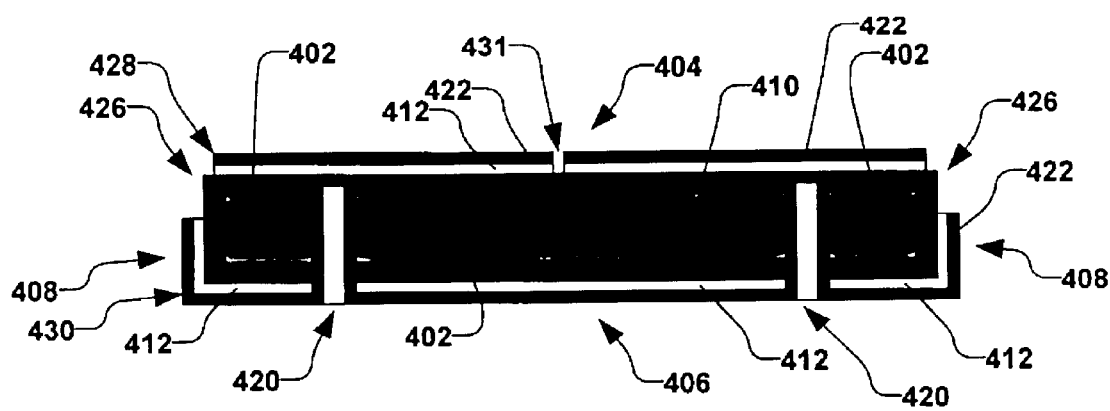
Figure 13K:
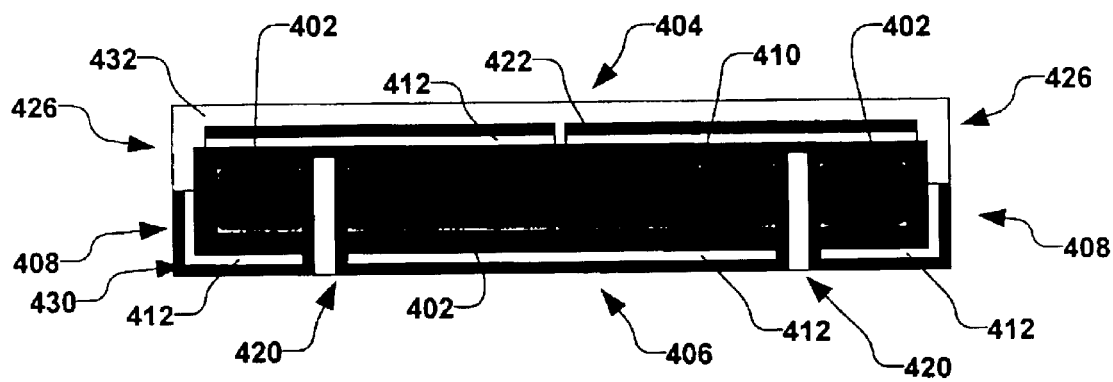
Figure 13L:
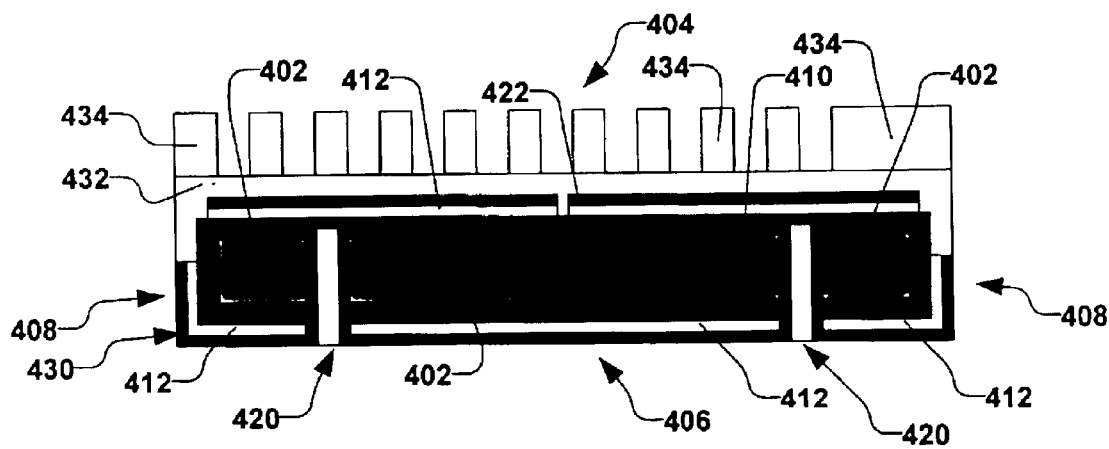
Figure 13M:
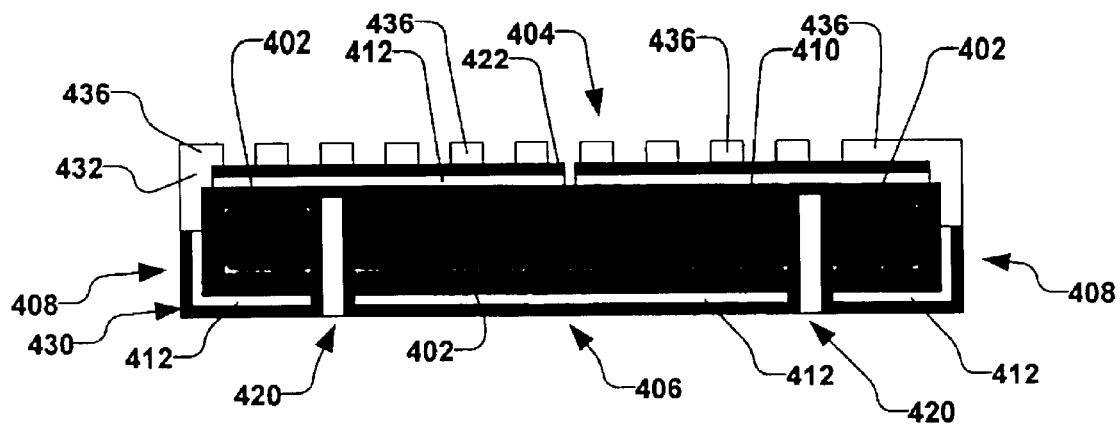
Figure 13N:
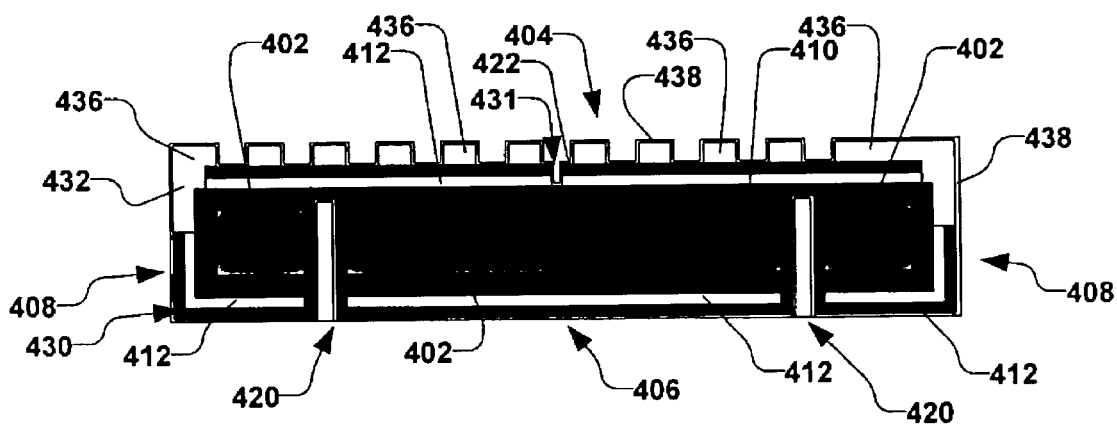
Figure 13O:
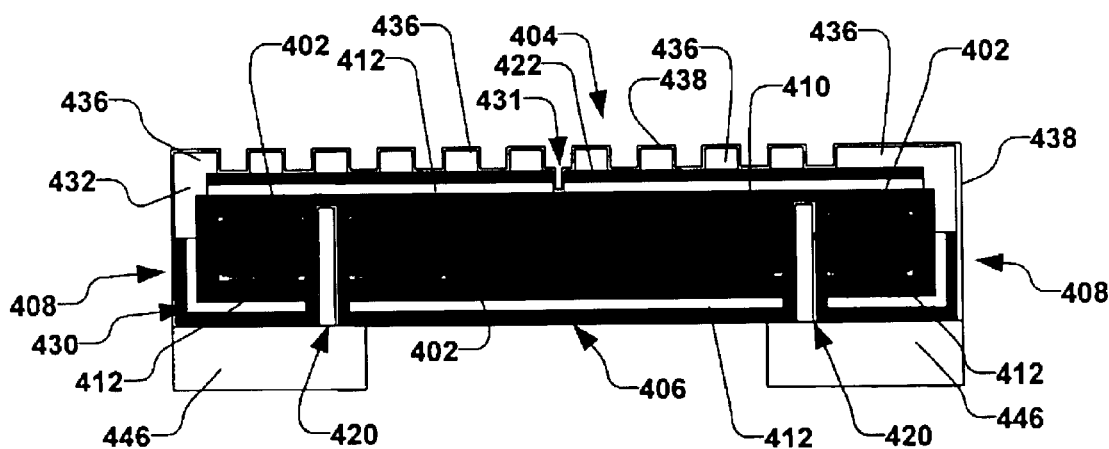
Figure 13P:
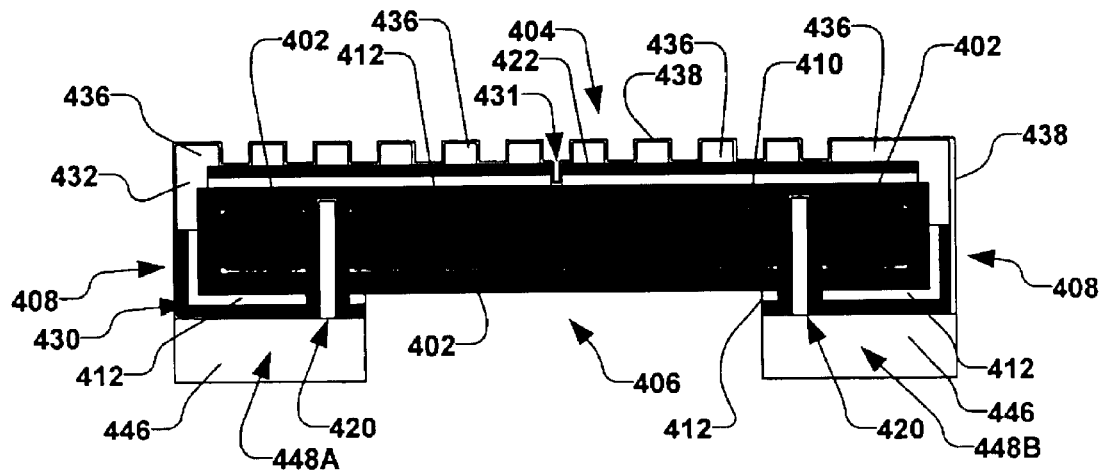
Figure 13Q:
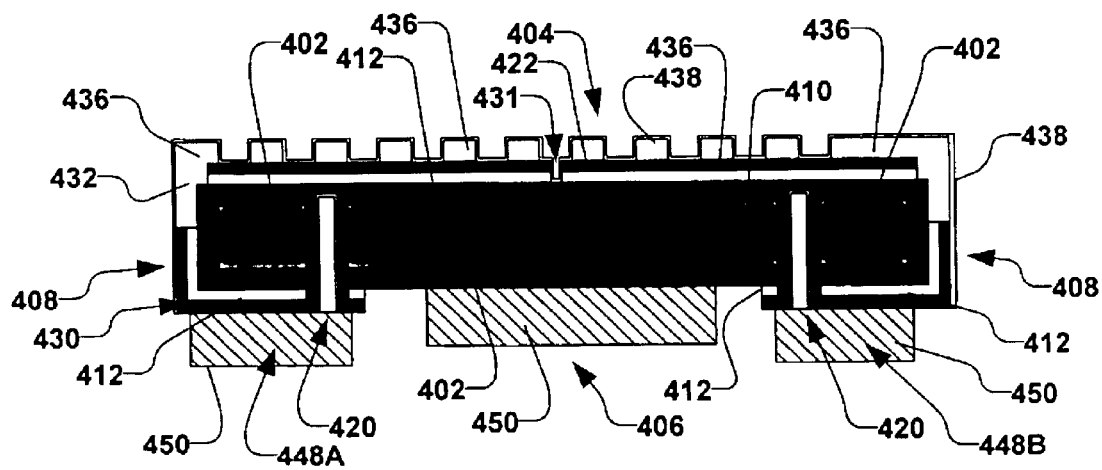

Referring again to FIG. 2, the base plate 160, for example, further comprises one or more first fluid conduits 200, wherein the one or more first fluid conduits are operable to generally permit a cooling fluid (not shown), such as water, to flow therethough, wherein the base plate is substantially cooled by the cooling fluid. As illustrated in FIG. 13Q, the base plate 450 may be electrically conductive and further comprise a plurality of poles 448, wherein the plurality of poles are electrically connected to the respective plurality of portions of the second electrically conductive layer 430, as will be discussed hereafter.

Referring again to FIG. 8, according to another exemplary aspect of the invention, a plurality of lift pins 210 are operatively coupled to the clamping plate 110, wherein the plurality of lift pins 210 are operable to vertically translate the substrate 105 between a processing position (not shown) proximate to the clamping plate 110 and a loading position (not shown) generally above the clamping plate (e.g., approximately 1–2 mm above the clamping plate). The lift pins 210, for example, are comprised of quartz, silicon carbide, or a ceramic material, wherein contamination of the substrate 105 from the lift pins during processing is minimized.

According to still another exemplary aspect of the present invention, the electrostatic chuck 100 further comprises a temperature sensor 215 operable to measure one or more temperatures T associated with the substrate 105 of FIG. 2. For example, the temperature sensor 215 of FIG. 8 comprises a pyrometer, wherein the pyrometer measures the temperature T of the substrate (not shown) through an opening 220 in the top surface 117 of the clamping plate 110. The temperature sensor 215 may comprise, for example, a pyrometer having a minimal volume cavity, wherein the opening 220 through which the pyrometer measures the temperature T of the substrate 105 is small. Minimizing the volume of the opening is advantageous, wherein temperature uniformity can be maintained. Alternatively, the temperature sensor 215 may comprise an optical pyrometer that may furthermore utilize fiber optic rods (not shown) inserted into the clamping plate 110 such that the fiber optic rod, for example, occupies the minimal volume cavity.

Figure 11:
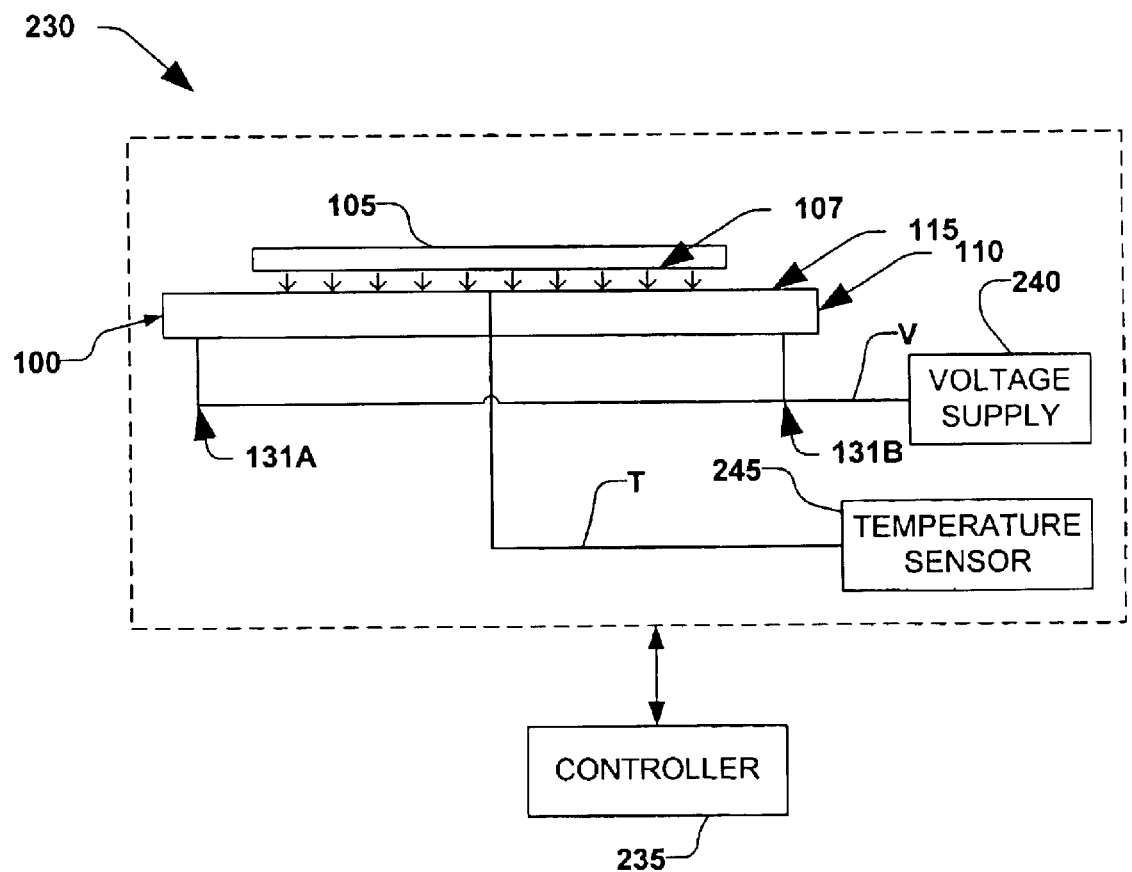
FIG. 11 is a system-level block diagram of an exemplary electrostatic chuck according an aspect of the present invention.

Referring now to FIG. 11, a block diagram of the electrostatic chuck 100 and a related system 230 is illustrated. According to one exemplary aspect of the present invention, the system 230 for controlling the electrostatic chuck comprises a controller 235 operatively coupled to a voltage supply 240. The controller 235 is operable to control the voltage V supplied to the ESC 100 by controlling the voltage supply 240, wherein the voltage is proportional to an amount of clamping force seen by the substrate 105 due to electrostatic forces induced by the voltage. The controller 235, for example, can further control an amount of contact HTC of the ESC 100 by increasing or decreasing the voltage V, whereby the electrostatic force, and hence the clamping force, is respectively increased or decreased. As illustrated again in FIG. 3, with a first distance $D_1$ of approximately 1 micron, the voltage V can be maintained well below a breakdown voltage associated with the semiconductor platform (e.g., a voltage of less than approximately 100V–15V).

As discussed above, controlling the voltage V applied to the electrostatic chuck 100 of FIG. 11 advantageously controls the amount of thermal conduction through the clamping plate. For example, with an area ratio of approximately 0.10 (10%), a low voltage (e.g., less than 20 volts) can be applied to the ESC 100, wherein low contact pressures of less than about 100 Torr can be maintained between the substrate 105 and the clamping plate 110. At the low contact pressure, the substrate 105 is still clamped or secured, but a minimal amount of thermal energy is transferred between the substrate and the electrostatic chuck 100, wherein a thermal portion of the chuck is substantially "off". When the larger voltage V (e.g., approximately 100 volts) is applied to the ESC 100, the contact pressure between the substrate 105 and the clamping plate 110 is substantially increased (e.g., increased to approximately 1–2 atmospheres), thereby quickly increasing the HTC between the substrate 105 and the clamping plate 110 (e.g., an increase of approximately 500 mW/cm$^2$C), and thus effectively turning the thermal portion of the chuck "on" for heating or cooling the substrate. Furthermore, according to another example, providing the first distance $D_1$ of FIG. 3 of approximately 1 micron is advantageous, wherein a thermal resistance between the substrate 105 and the clamping plate 110 is minimized, thereby decreasing heat loss effects. It should be noted, however, that other values for the first distance $D_1$ are contemplated as falling within the scope of the present invention.

The controller 235 of the present invention controls the contact pressure by quickly controlling the voltage V applied to the ESC 100, thereby allowing the ESC to quickly change states (e.g., from a heating condition to a cooling condition). The controller 235, for example, is further operable to feed back wafer temperature data T from a temperature sensor 245 associated with the ESC, wherein the voltage supply 240 can be controlled in a closed-loop feedback arrangement. Alternatively, the controller 235 is operable to generally limit the HTC between the substrate 105 and the ESC 100 when a predetermined temperature is reached.

The present invention is also directed toward a method for forming a semiconductor-based multi-polar electrostatic chuck. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 12:
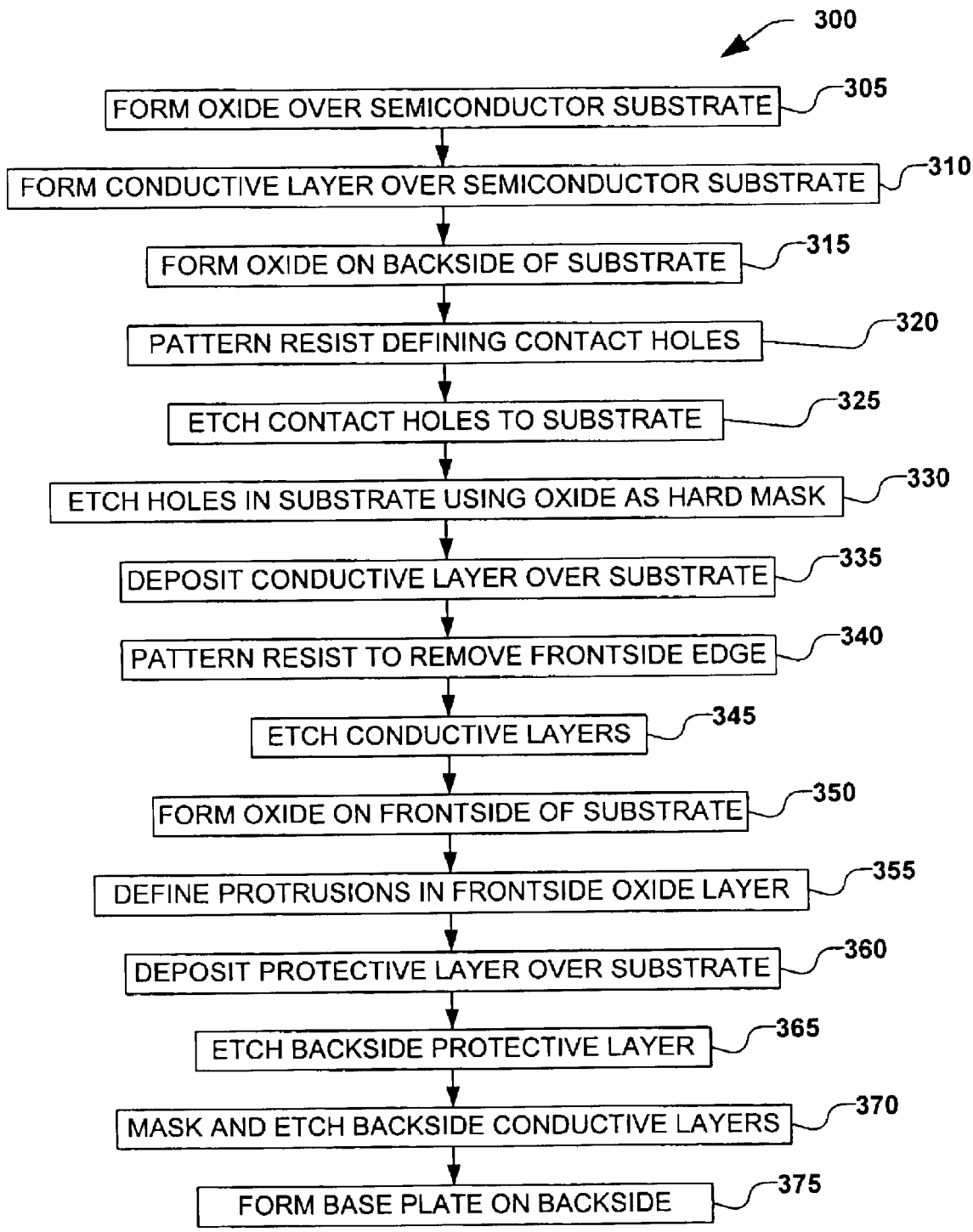
FIG. 12 is a flow chart diagram illustrating an exemplary methodology for forming a semiconductor-based electrostatic chuck according to the present invention.

As illustrated in FIG. 12, a method 300 of forming a multi-polar ESC can be discussed with reference to FIGS. 16A–16Q. Beginning with act 305 of FIG. 12, an oxide is formed over a semiconductor substrate. As illustrated in FIG. 13A, the oxide layer 402 is formed over a frontside 404, a backside 406, and a sidewall 408 of the semiconductor substrate 410 (e.g., a 2 micron SiO$_2$ layer grown over a double-polished 300 mm silicon wafer). In act 310 of FIG. 12, a conductive layer is formed over the substrate. For example, as illustrated in FIG. 13B, the conductive layer 412 comprises a doped poly-silicon film of approximated 1 micron formed over the frontside 404, backside 406, and sidewall 408 of the substrate 410. In act 315 of FIG. 12, an oxide layer is formed on the backside of the substrate, as further illustrated in FIG. 13C. The oxide 414, for example, comprises a 2 micron deposition of $SiO_2$, wherein the oxide 414 covers the backside 406 of the substrate 410, as well as partially covering the sidewall 408 of the substrate.

Referring again to FIG. 12, act 320 describes the act of patterning a resist layer to define contact holes and gas holes. FIG. 13D illustrates the resist 416 is patterned over the backside 406 of the substrate 410, wherein the resist generally defines a contact hole 420. Note that the number of contact holes 420 illustrated in the figures is shown for simplicity, and numerous contact holes may be defined. The contact hole 420, for example, is utilized to define a frontside contact (not shown), as will be discussed hereafter. In act 325 of FIG. 12, the contact hole is etched, wherein FIG. 13E illustrates the result, wherein the oxide layers 402 and 414 and the conductive layer 412 are etched, therein further defining the contact hole 420. The resist is subsequently stripped, and in act 330 of FIG. 12, the contact hole is further etched in the substrate. FIG. 13F illustrates the result of act 330, wherein the substrate 410 is etched, and wherein the oxide layers 402 and 414 are further etched, using the conductive layer 412 as an etch stop. The oxide layers 402 and 414, can be etched using, for example, a wet etch or reactive ion etch (RIE) process.

Act 335 of FIG. 12 illustrates a deposition of a conductive layer over the substrate. FIG. 13G illustrates the result of act 335, wherein the conductive layer 422 is deposited over the substrate 410 (e.g., a chemical vapor deposition (CVD) of 0.1 micron of $WSi_2$), including the frontside 404, backside 406, sidewall 408 of the substrate, as well as inside of the contact hole 420. The conductive layer 422, for example, may comprise one or more of the first electrically conductive layer 125, the second electrically conductive layer 165, or the third electrically conductive layer 194, as illustrated in FIGS. 2, 9, and 10.

In act 340 of FIG. 12, a photoresist is patterned over the frontside of the substrate for removing a frontside edge of the conductive layer. FIG. 13H illustrates the photoresist 424 formed over the frontside 404 of the substrate 410, wherein the frontside edge 426 and an isolator region 427 are not covered by the photoresist. In act 345 of FIG. 12, the conductive layers are etched. FIG. 13I illustrates the result of performing act 345, wherein the frontside edge 426 is generally etched, and wherein the conductive layer 422 and conductive layer 412 are generally removed in along the frontside edge 426, therein generally electrically isolating a first electrically conductive layer 428 from a second electrically conductive layer 430, as well as defining a plurality of electrically isolated poles 448. FIG. 13J illustrates the first electrically conductive layer 428 and second electrically conductive layer 430 after the photoresist is removed.

Act 350 of FIG. 12 illustrates the act of forming a frontside oxide over the frontside of the substrate. FIG. 13K illustrates the oxide layer 432 formed over the frontside 404 of the substrate 410, wherein the frontside oxide 432 generally covers the first electrically conductive layer 428 and further generally covers the frontside edge 426. In act 355 of FIG. 12, a plurality of protrusions are formed in the frontside oxide layer. FIGS. 13L–13M illustrate the formation of the plurality of protrusions. In FIG. 13L, a photoresist 434 is patterned over the frontside oxide layer 434, and the frontside oxide layer is subsequently etched, wherein the plurality of protrusions 436 of FIG. 13M are generally defined after removal of the photoresist 434. Referring again to FIG. 12, act 360 illustrates a deposition of a protective layer over the substrate. In FIG. 13N, the protective layer 438 is generally formed over the substrate 410, wherein the frontside 404, backside 406, and sidewall 408 of the substrate are generally covered by the protective layer, as well as in the isolator region 431. The protective layer 438, for example, comprises a nitride (e.g., silicon nitride $Si_3N_4$) of approximately 0.1 microns. The protective layer 438 can furthermore be etched from the backside 406 of the substrate 410.

In act 370 of FIG. 12, the second electrically conductive layer 430 is masked and etched to generally electrically isolate a plurality of poles generally defining the poles of an electrostatic chuck. FIG. 13O illustrates the formation of the mask 446 over the backside 406 of the substrate 410. FIG. 13P illustrates the result of etching the second electrically conductive layer 430 and the conductive layer 412, wherein the plurality of poles 448 are electrically isolated from one another. In act 375 of FIG. 12, a base plate is generally formed over the backside of the substrate, wherein the base plate is operable to generally transfer heat from the electrostatic chuck. FIG. 13Q illustrates the result of performing act 375, wherein the base plate 450 is formed over the backside 406 of the substrate 410. For example, the base plate 450 comprises aluminum which is evaporated onto the backside 406 though a ring mask (not shown) to protect the poly film 412.

The present invention is also directed toward a method for processing a semiconductor substrate. Initially, the method 500 of FIG. 14 of the present invention can be discussed in conjunction with the exemplary system 230 of FIG. 11 that is described herein. The electrostatic chuck 100, for example, can also be local to a heat source (not shown), wherein the substrate 105 can be selectively heated. A contact area ratio AR between a top surface 115 of the clamping plate 110 and the bottom surface 107 of the substrate 105 is small (e.g., about 10%) wherein contact conductivity is optimized, as described above. Furthermore, a surface roughness of the top surface 115 is approximately 100 Angstroms or less. Therefore, by electrostatically clamping the substrate and then controlling the voltage V applied to the two or more poles 131 of the ESC 100, the system 230 can quickly transition between heating and cooling in an advantageous manner.

Figure 8:
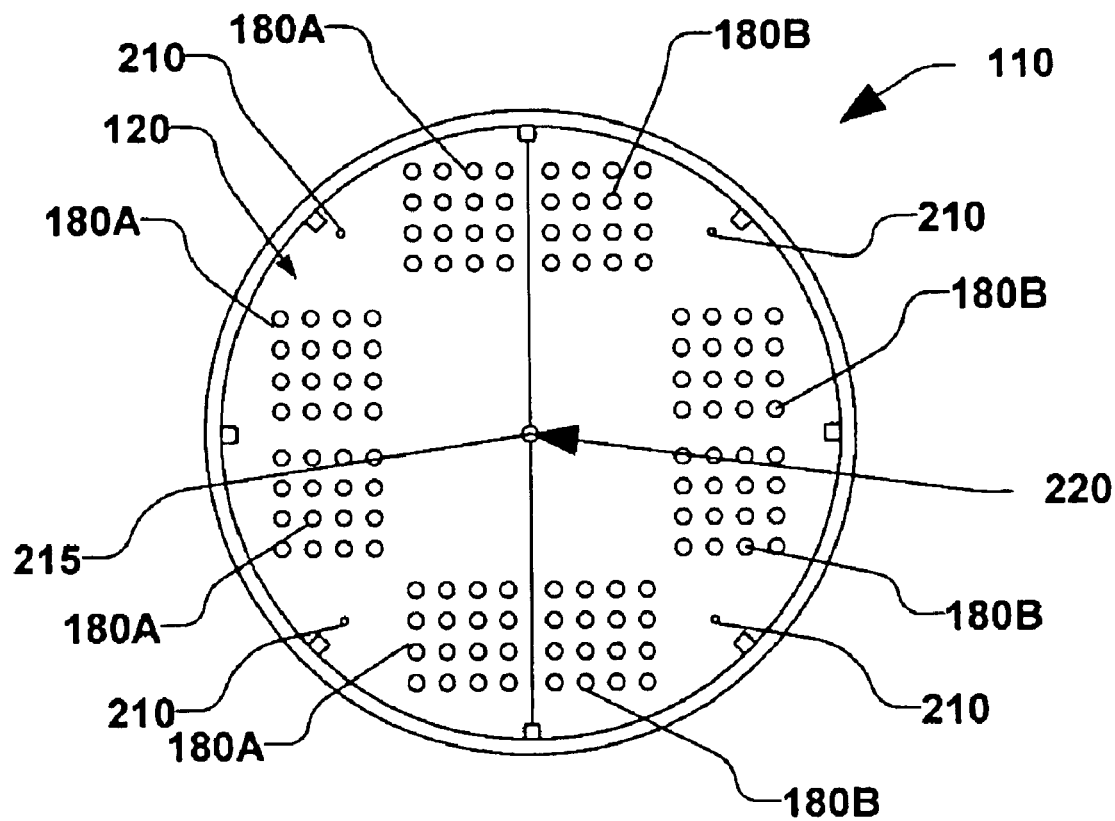
FIG. 8 is a plan view of an exemplary clamping plate comprising a plurality of vias according one aspect of the present invention.
Figure 14:
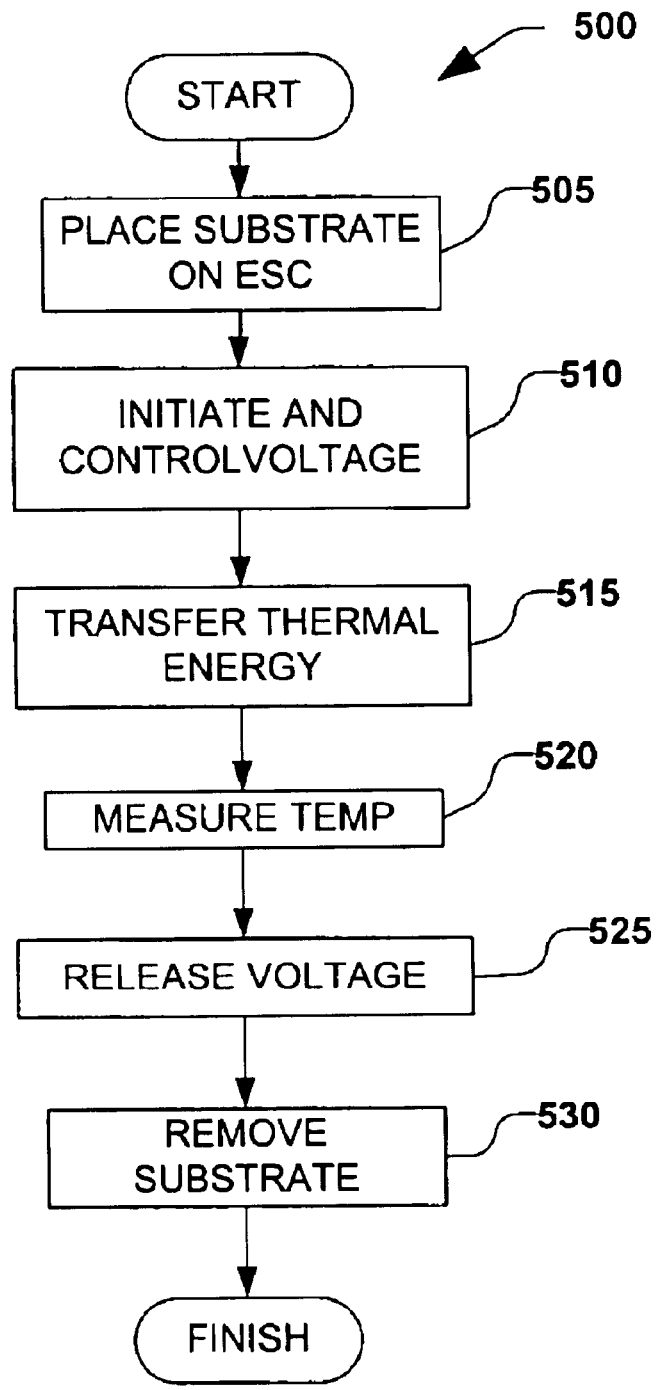
FIG. 14 is a flow chart diagram illustrating an exemplary methodology for thermally processing a semiconductor substrate according to the present invention.

The exemplary method 500 of FIG. 14 for processing the substrate begins at act 505, wherein a substrate is placed on a clamping plate having a plurality of protrusions extending from a top surface of the clamping plate. For example, the substrate 105 of FIG. 15 is placed on the plurality of protrusions (not shown) via a plurality of pins (e.g., as illustrated in FIG. 8), wherein the plurality of pins are translated from a loading position generally above the top surface 115 of the clamping plate 110 to a processing position generally below the top surface. According to one exemplary aspect of the invention, the plurality of pins extend a minimal distance (e.g., less than 1 mm) from the top surface 115 of the clamping plate 110 when the pins are in the loading position. According to another exemplary aspect of the invention, the plurality of protrusions extend a first distance (not shown) from the top surface 115 of the clamping plate 110, such as a distance of approximately 1 micron, wherein the plurality of protrusions further have a surface roughness of less than approximately 100 Angstroms. Preferably, the plurality of protrusions comprise an array of micro-electromechanical structures, wherein each of the plurality of micro-electromechanical structures have a surface roughness of approximately 10 Angstroms or less.

In act 510 of FIG. 14, a voltage is applied to the clamping plate, wherein the substrate is electrostatically clamped to the clamping plate. According to one exemplary aspect of the invention, a first voltage is applied to the clamping plate by the voltage supply 240 of FIG. 11, wherein the first voltage is operable to significantly clamp the substrate 105 in place, while not significantly permitting a transfer of thermal energy between the substrate and the clamping plate 110. For example, the first voltage is approximately 20 volts, wherein a contact pressure between the substrate 105 and the clamping plate 110 is approximately 10–20 Torr. During the clamping at the first voltage, for example, the substrate may be heated or otherwise processed. A second voltage may be subsequently or alternatively applied to the clamping plate 115, wherein the voltage, and hence, the contact pressure between the substrate 105 and the clamping plate is controlled by the controller 235 such that a contact heat transfer coefficient is significantly increased (e.g., a second voltage of approximately 100 volts yielding a clamping pressure of approximately 300 Torr or greater, based upon a 1 micron gap distance). According to one exemplary aspect of the invention, the first voltage is preferably greater than 10 volts, and the second voltage is less than 500 volts (e.g., wherein the second voltage is less than a breakdown voltage of the oxide).

In act 515 of FIG. 14, thermal energy is transferred between the substrate and the clamping plate, wherein the voltage is controlled and the substrate is substantially heated or cooled. For example, the substrate 105 of FIG. 11 is respectively heated or cooled such as by heating the base plate (not shown) or by flowing a cooling fluid through the base plate. According to one exemplary aspect of the present invention, in act 520, a temperature associated with one or more locations on the substrate is measured. For example, the temperature sensor 245 of FIG. 11 measures the temperature T of the substrate 105 and feeds the temperature back to the controller 235. According to one example, if the temperature T does not match a predetermined temperature, the second voltage can be modified or maintained in accordance with the measured temperature, wherein the transfer of thermal energy can be modified or maintained by further controlling the voltage V.

In act 525 of FIG. 14, the voltage is halted or otherwise decreased, wherein the contact pressure between the substrate and the clamping plate is substantially released, thereby substantially halting the thermal transfer. Act 525 can further release the voltage altogether from the clamping plate, thereby generally releasing the substrate from the electrostatic force. The method 500 concludes with act 530, wherein the substrate is removed from the ESC, such as by raising the pins back into the loading position, wherein the substrate can be removed from the ESC.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of clamping and processing a substrate, comprising:
    placing the substrate on a clamping plate having a plurality of protrusions extending a first distance from a top surface thereof, wherein the plurality of protrusions have a surface roughness of approximately 100 Angstroms or less, and wherein the plurality of protrusions generally contact the substrate, therein defining a protrusion contact area;
    applying a voltage between a plurality of poles of the clamping plate, wherein an electrostatic force associated with the plurality of poles generally attracts the substrate to the top surface of the clamping plate; and
    controlling the voltage such that a contact pressure between the substrate and the plurality of protrusions is controlled, therein controlling a thermal transfer between the substrate and the clamping plate.

2. The method of claim 1, wherein the clamping plate further comprises a semiconductor platform, wherein thermal energy is further transferred through the semiconductor platform.

3. The method of claim 2, wherein applying the voltage between the plurality of poles comprises applying the voltage between a plurality of portions of a first electrically conductive layer associated with a top surface of the semiconductor platform, wherein the plurality of portions are generally electrically isolated from one another.

4. The method of claim 3, wherein the plurality of protrusions are generally electrically insulative and are formed over the first electrically conductive layer.

5. The method of claim 3, wherein applying the voltage between the plurality of poles further comprises applying the voltage to a plurality of portions of a second electrically conductive layer formed over a bottom surface of the semiconductor platform, wherein the plurality of portions of the second electrically conductive layer are generally electrically isolated from one another, and wherein the second electrically conductive layer comprises a plurality of vertical interconnects electrically connected to the first electrically conductive layer.

6. The method of claim 5, wherein applying the voltage between the plurality of poles further comprises applying the voltage to a plurality of spring-forced sidewall contact electrodes, wherein the plurality of spring-forced sidewall contact electrodes electrically contact the respective plurality of vertical interconnects.

7. The method of claim 3, wherein the first electrically conductive layer comprises one or more of tungsten silicide, tungsten, or titanium.

8. The method of claim 3, wherein the first electrically insulative layer is comprised of silicon dioxide.

9. The method of claim 2, further comprising transferring thermal energy from the substrate through the semiconductor platform to a base plate associated with the clamping plate.

10. The method of claim 9, wherein the base plate is comprised of amorphous silicon, aluminum, or copper.

11. The method of claim 9, further comprising flowing a cooling fluid through one or more fluid conduits associated with the base plate, wherein thermal energy is transferred between the cooling fluid and the base plate, therein cooling the substrate.

12. The method of claim 9, further comprising heating the base plate, wherein the substrate is selectively heated.

13. The method of claim 2, wherein the semiconductor platform is comprised of silicon.

14. The method of claim 13, wherein the plurality of protrusions are generally comprised of silicon dioxide.

15. The method of claim 2, wherein the plurality of protrusions comprise an array of micro-electromechanical structures.

16. The method of claim 15, wherein each of the plurality of micro-electromechanical structures have a surface roughness of approximately 10 Angstroms or less.

17. The method of claim 1, wherein the voltage applied between the plurality of poles is less than 150V.

18. The method of claim 1, wherein a ratio of the protrusion contact area to a surface area of the substrate is less than approximately 0.5.

19. The method of claim 18, wherein a ratio of the protrusion contact area to a surface area of the substrate is between about 0.02 and 0.2.

20. The method of claim 19, wherein ratio of the protrusion contact area to a surface area of the substrate is approximately 0.10.

21. The method of claim 1, wherein the first distance is approximately 1 micron.

22. The method of claim 1, further comprising measuring a temperature associated with the substrate, wherein the measured temperature is utilized in controlling the voltage, therein controlling the thermal transfer between the substrate and the clamping plate.

23. The method of claim 22, wherein the control is based on the substrate reaching a predetermined temperature.

24. The method of claim 22, wherein the control is based on a closed-loop feedback of the temperature.

25. The method of claim 1, wherein applying the voltage further comprises applying a first voltage and a second voltage between the plurality of poles, wherein the first voltage is operable to generally maintain a position of the substrate while maintaining a low heat transfer coefficient between the substrate and the plurality of protrusions, and the second voltage is operable to increase the heat transfer coefficient.

26. The method of claim 25, wherein the first voltage is greater than 10 V and the second voltage is less than 500 V.

* * * * *